(12) United States Patent
Shen et al.

(10) Patent No.: US 12,727,522 B2
(45) **Date of Patent: *Sep. 1, 2026**

(54) METHOD OF FABRICATING PACKAGE STRUCTURE

(71) Applicant: Taiwan Semiconductor Manufacturing Company, Ltd., Hsinchu (TW)

(72) Inventors: Wen-Wei Shen, Hsinchu (TW); Sung-Hui Huang, Yilan County (TW); Shang-Yun Hou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/766,684

(22) Filed: Jul. 9, 2024

(65) Prior Publication Data

US 2024/0363587 A1 Oct. 31, 2024

Related U.S. Application Data

(63) Continuation of application No. 17/853,949, filed on Jun. 30, 2022, now Pat. No. 12,080,681, which is a (Continued)

(51) Int. Cl.
*H10W 70/63* (2026.01)
*H10W 70/05* (2026.01)
(Continued)

(52) U.S. Cl.
CPC .......... *H10W 90/00* (2026.01); *H10W 70/06* (2026.01); *H10W 70/096* (2026.01);
(Continued)

(58) Field of Classification Search
CPC ... H01L 21/561; H01L 21/563; H01L 21/486; H01L 21/4857; H01L 21/78;
(Continued)

(56) References Cited

U.S. PATENT DOCUMENTS 6,800,945 B2 * 10/2004 Naka .................... H01L 21/563 257/E23.101
8,802,504 B1 8/2014 Hou et al.
(Continued)

*Primary Examiner* — Yu Chen
(74) *Attorney, Agent, or Firm* — JCIPRNET

(57) ABSTRACT

A package structure includes a circuit substrate and a semiconductor device. The semiconductor device is disposed on and electrically connected to the circuit substrate. The semiconductor device includes an interconnection structure, a semiconductor die, an insulating encapsulant, a protection layer and electrical connectors. The interconnection structure has a first surface and a second surface. The semiconductor die is disposed on the first surface and electrically connected to the interconnection structure. The insulating encapsulant is encapsulating the semiconductor die and partially covering sidewalls of the interconnection structure. The protection layer is disposed on the second surface of the interconnection structure and partially covering the sidewalls of the interconnection structure, wherein the protection layer is in contact with the insulating encapsulant. The electrical connectors are disposed on the protection layer, wherein the interconnection structure is electrically connected to the circuit substrate through the plurality of electrical connectors.

20 Claims, 21 Drawing Sheets

Related U.S. Application Data continuation of application No. 16/903,392, filed on Jun. 17, 2020, now Pat. No. 11,424,219.

(60) Provisional application No. 62/961,717, filed on Jan. 16, 2020.

(51) Int. Cl.

| | |
|---|---|
| ***H10W 70/06*** | (2026.01) |
| ***H10W 70/60*** | (2026.01) |
| ***H10W 70/65*** | (2026.01) |
| ***H10W 74/01*** | (2026.01) |
| ***H10W 74/10*** | (2026.01) |
| ***H10W 90/00*** | (2026.01) |
| *H10P 72/70* | (2026.01) |
| *H10W 74/15* | (2026.01) |

(52) U.S. Cl.

CPC ........ *H10W 70/611* (2026.01); *H10W 70/635* (2026.01); *H10W 70/65* (2026.01); *H10W 74/014* (2026.01); *H10W 74/131* (2026.01); *H10W 90/401* (2026.01); *H10P 72/74* (2026.01); *H10P 72/7418* (2026.01); *H10P 72/7424* (2026.01); *H10W 74/012* (2026.01); *H10W 74/15* (2026.01)

(58) Field of Classification Search

CPC ............. H01L 23/3121; H01L 23/3128; H01L 23/3135; H01L 23/3157; H01L 23/3178; H01L 23/49827; H01L 23/5384; H01L 23/49838; H01L 23/5386; H01L 23/49833; H01L 23/5385; H01L 2221/68359; H01L 2221/68345; H01L 2221/68331; H10W 74/014; H10W 74/019; H10W 70/06; H10W 70/096; H10W 70/611; H10W 70/614; H10W 70/63; H10W 70/634; H10W 90/401

See application file for complete search history.

(56) References Cited

U.S. PATENT DOCUMENTS

| | | | | |
|---|---|---|---|---|
| 8,803,292 | B2 | 8/2014 | Chen et al. | |
| 8,803,316 | B2 | 8/2014 | Lin et al. | |
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,496,189 | B2 | 11/2016 | Yu et al. | |
| 11,164,824 | B2 * | 11/2021 | Tsai | H01L 23/3135 |
| 11,424,219 | B2 * | 8/2022 | Shen | H01L 25/0655 |
| 2017/0047310 | A1 * | 2/2017 | Shim | H01L 21/568 |
| 2017/0263544 | A1 * | 9/2017 | Hiner | H01L 23/3107 |
| 2018/0190638 | A1 * | 7/2018 | Chen | H01L 23/3128 |
| 2019/0006256 | A1 * | 1/2019 | Huang | H01L 24/81 |
| 2020/0411399 | A1 * | 12/2020 | Wu | H01L 21/561 |

* cited by examiner 116
117A-2
100
102a
114-2
SM2
117A-1
BVP
102b
112
114-1
118
22
104
117A-1
21
106
117B
110
102
114
114-1
114-2
114-1S
117A
117A-1
117A-2
114-2S
117

METHOD OF FABRICATING PACKAGE STRUCTURE

CROSS-REFERENCE TO RELATED APPLICATION

This application is a continuation application of U.S. application Ser. No. 17/853,949, filed on Jun. 30, 2022, now allowed. The prior application Ser. No. 17/853,949 claims the priority benefit of U.S. application Ser. No. 16/903,392, filed on Jun. 17, 2020, now patented as U.S. Pat. No. 11,424,219, issued on Aug. 23, 2022. The prior application Ser. No. 16/903,392 claims the priority benefit of U.S. provisional application Ser. No. 62/961,717, filed on Jan. 16, 2020. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
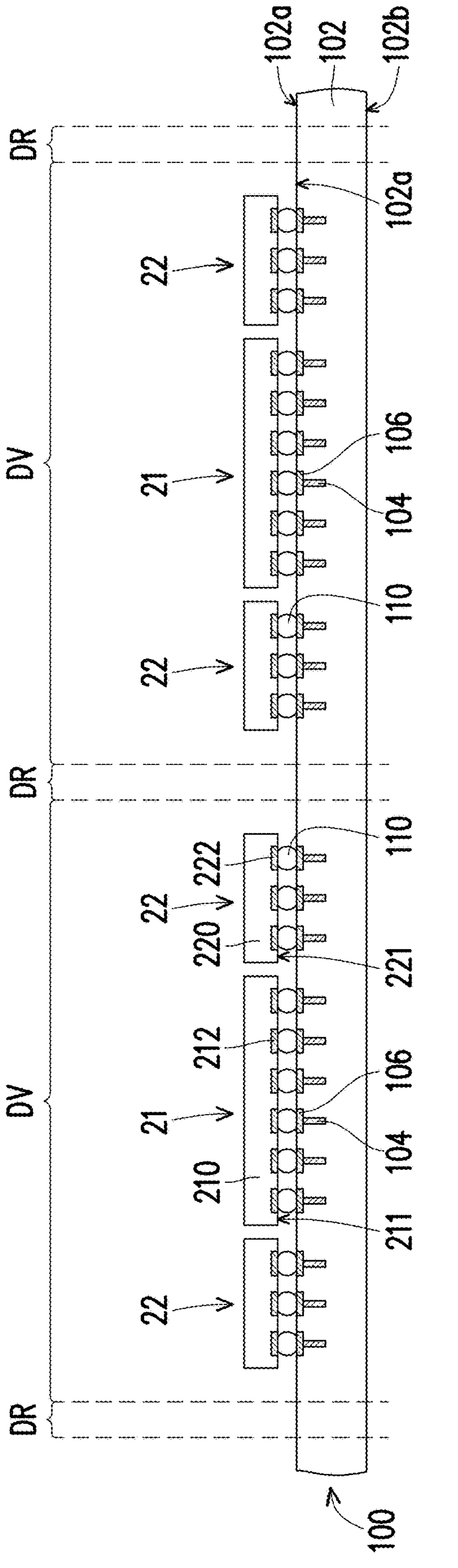
FIG. 1A to FIG. 1K are schematic sectional views of various stages in a method of fabricating a semiconductor device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath”, “below”, “lower”, “on”, “over”, “overlying”, “above”, “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are schematic sectional views of various stages in a method of fabricating a semiconductor device according to some exemplary embodiments of the present disclosure. Referring to FIG. 1A, an interposer structure 100 (or interconnection structure) is provided. In some embodiments, the interposer structure 100 (or interconnection structure) includes a core substrate 102, and a plurality of through vias 104 and conductive pads 106 formed therein. In some embodiments, the core substrate 102 may be a substrate such as a bulk semiconductor substrate, SOI substrate or a multi-layered semiconductor material substrate. The semiconductor material of the substrate (core substrate 102) may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the core substrate 102 may be doped or undoped.

In some embodiments, the conductive pads 106 are formed on a first surface 102*a* of the core substrate 102 (first surface 102*a* of interposer structure 100). In some embodiments, through vias 104 are formed in the core substrate 102 and connected with the conductive pads 106. In some embodiments, the through vias 104 extend into the core substrate 102 with a specific depth. In some embodiments, the through vias 104 are through-substrate vias. In some embodiments, the through vias 104 are through-silicon vias when the core substrate 102 is a silicon substrate. In some embodiments, the through vias 104 may be formed by forming holes or recesses in the core substrate 102 and then filling the recesses with a conductive material. In some embodiments, the recesses may be formed by, for example, etching, milling, laser drilling or the like. In some embodiments, the conductive material may be formed by an electro-chemical plating process, chemical vapor deposition (CVD), atomic layer deposition (ALD) or physical vapor deposition (PVD), and the conductive material may include copper, tungsten, aluminum, silver, gold or a combination thereof. In some embodiments, the conductive pads 106 connected with the through vias 104 may be formed as conductive parts of the redistribution layer(s) formed on the interposer structure 100. In some embodiments, the conductive pads 106 include under bump metallurgies (UBMs). In certain embodiments, the interposer structure 100 may further include active or passive devices, such as transistors, capacitors, resistors, or diodes passive devices formed in the core substrate 102.

As illustrated in FIG. 1A, the core substrate 102 has a plurality of device regions DV and a dicing region DR separating each of the plurality of device regions DV. The through vias 104 and conductive pads 106 are formed in the core substrate 102 within the device regions DV. In some embodiments, the semiconductor dies 21 and semiconductor dies 22 are provided on the interposer structure 100 (interconnection structure), or on the core substrate 102 within the device regions DV. For example, the semiconductor dies 21 and semiconductor dies 22 are disposed on the first surface 102*a* of the interposer structure 100. The semiconductor dies 21 and semiconductor dies 22 are individual dies singulated from a wafer. In some embodiments, the semiconductor dies 21 contain the same circuitry, such as devices and metallization patterns, or the semiconductor dies 21 are the same type of dies. In some embodiments, the semiconductor dies 22 contain the same circuitry, or the semiconductor dies 22 are the same type of dies. In certain embodiments, the semiconductor dies 21 and the semiconductor dies 22 have different circuitry or are different types of dies. In alternative embodiments, the semiconductor dies 21 and the semiconductor dies 22 may have the same circuitry.

In some embodiments, the semiconductor dies 21 may be major dies, while the semiconductor dies 22 are tributary dies. In some embodiments, the major dies are arranged on the core substrate 102 in central locations of each device regions DV, while tributary dies are arranged side-by-side and spaced apart from the major dies. In some embodiments, the tributary dies are arranged aside the major dies, and around or surrounding the major dies. In one embodiment, four or six tributary dies are arranged around one major die per one device region DV. However, the number of semiconductor dies located on the interposer structure 100 is not limited thereto, and this could be adjusted based on product requirements. For example, in alternative embodiments, the number of dies located on the interposer structure 100 may be one, or more than one.

Referring back to FIG. 1A, the semiconductor dies 21 has a surface area larger than that of the semiconductor dies 22. Also, in some embodiments, the semiconductor dies 21 and the semiconductor dies 22 may be of different sizes, including different surface areas and/or different thicknesses. In some embodiments, the semiconductor dies 21 may be a logic die, including a central processing unit (CPU) die, graphics processing unit (GPU) die, system-on-a-chip (SoC) die, a microcontroller or the like. In some embodiments, the semiconductor dies 21 is a power management die, such as a power management integrated circuit (PMIC) die. In some embodiments, the semiconductor dies 22 may be a memory die, including dynamic random access memory (DRAM) die, static random access memory (SRAM) die or a high bandwidth memory (HBM) die. The disclosure is not limited thereto, and the number, sizes and types of the semiconductor die disposed on the core substrate 102 may be appropriately adjusted based on product requirement.

In the illustrated embodiment, the semiconductor dies 21 include a body 210 and connecting pads 212 formed on an active surface 211 of the body 210. In certain embodiments, the connecting pads 212 may further include pillar structures for bonding the semiconductor dies 21 to other structures. In some embodiments, the semiconductor dies 22 include a body 220 and connecting pads 222 formed on an active surface 221 of the body 220. In other embodiments, the connecting pads 222 may further include pillar structures for bonding the dies 22 to other structures.

In some embodiments, the semiconductor dies 21 and the semiconductor dies 22 are attached to the first surface 102*a* of the core substrate 102, for example, through flip-chip bonding by way of the conductive bumps 110. Through the reflow process, the conductive bumps 110 are formed between the connecting pads 212, 222 and conductive pads 106, electrically and physically connecting the semiconductor dies 21, 22 to the core substrate 102 of the interposer structure 100. In some embodiments, the conductive bumps 110 are located in between the semiconductor dies 21, 22 and the interposer structure 100 (or interconnection structure). In certain embodiments, semiconductor dies 21, 22 are electrically connected to the through vias 104 and the conductive pads 106 through the conductive bumps 110. In one embodiment, the conductive bumps 110 are micro-bumps, such as micro-bumps having copper metal pillars. In another embodiment, the conductive bumps 110 are solder bumps, lead-free solder bumps, or micro bumps, such as controlled collapse chip connection (C4) bumps or micro bumps containing copper pillars. In some embodiments, the bonding between the semiconductor dies 21, 22 and the core substrate 102 may be solder bonding. In some embodiments, the bonding between the semiconductor dies 21, 22 and the core substrate 102 may be direct metal-to-metal bonding, such as copper-to-copper bonding.

Figure 1B:
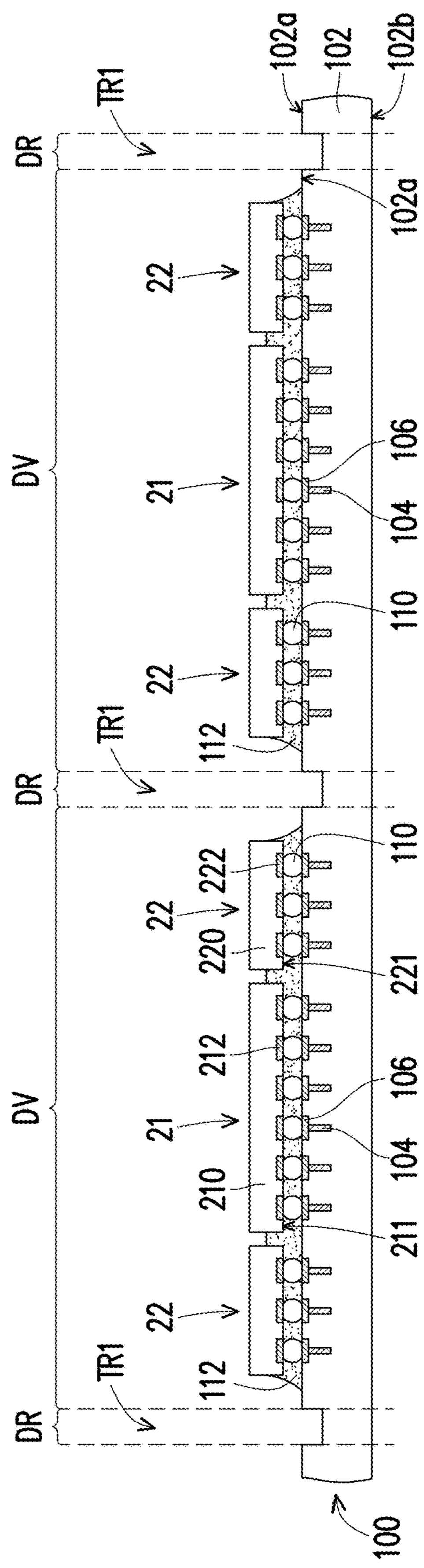

Referring to FIG. 1B, in a next step, an underfill structure 112 may be formed to cover the plurality of conductive bumps 110, and to fill up the spaces in between the semiconductor dies 21, 22 and the interposer structure 100. In some embodiments, the underfill structure 112 further cover side walls of the semiconductor dies 21, 22, and is located within the device regions DV. After disposing the semiconductor dies 21, 22 and forming the underfill structure 112 to protect the conductive bumps 110, a first trench TR1 is formed on the first surface 102*a* of the interposer structure 100 (interconnection structure) within the dicing region DR. In the exemplary embodiment, the first trench TR1 is surrounding the semiconductor dies 21, 22. For example, from a top view of the interposer structure 100 (not illustrated), the semiconductor dies 21, 22 may be confined in a space surrounded by the first trench TR1. In certain embodiments, the first trench TR1 may be formed by a laser cutting process, a mechanical sawing process, or other suitable processes. The disclosure is not limited thereto.

Figure 1C:
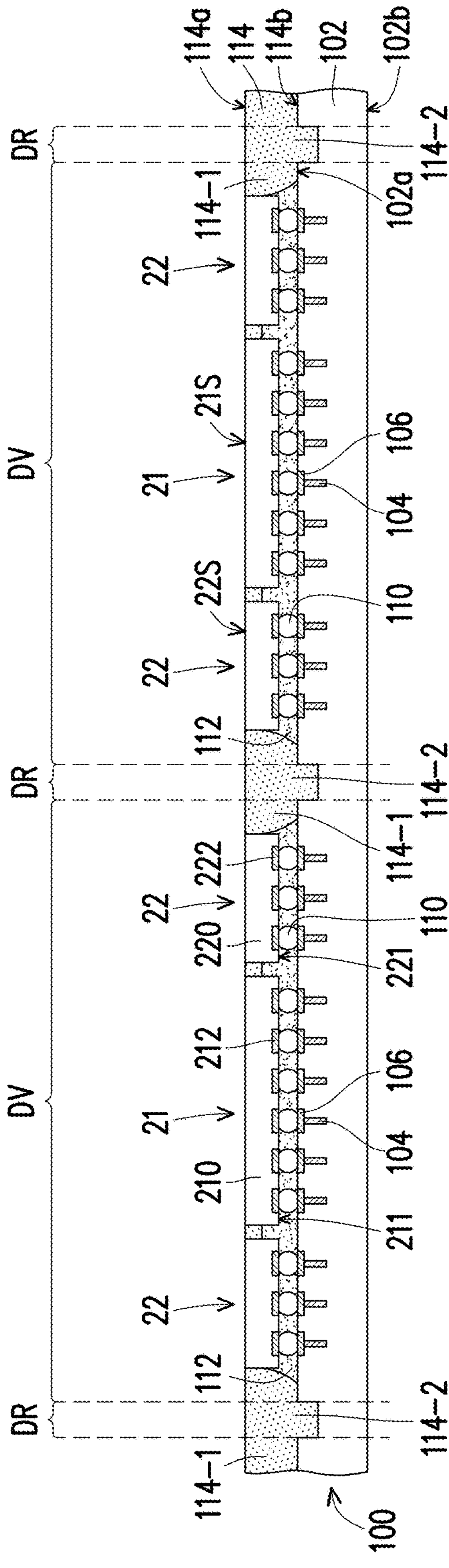

Referring to FIG. 1C, after forming the first trench TR1, an insulating encapsulant 114 is formed over the device regions DV and the dicing region DR on the first surface 102*a* of the interposer structure 100 (interconnection structure). For example, the insulating encapsulant 114 is formed over the interposer structure 100 to encapsulate the semiconductor dies 21 and 22 and is filled into the first trench TR1. The insulating encapsulant 114 may further cover the underfill structure 112. In some embodiments, the insulating encapsulant 114 may have a first portion 114-1 that is surrounding the semiconductor dies 21 and 22, and a second protruding portion 114-2 that is surrounding the first portion 114-1 and partially surrounding the interposer structure 100.

In certain embodiments, the first portion 114-1 is located in the device region DV, whereas the second portion 114-2 is located in the dicing region DR and filled into the first trench TR1.

Furthermore, in some embodiments, the insulating encapsulant 114 is formed through, for example, a compression molding process or transfer molding. In one embodiment, a curing process is performed to cure the insulating encapsulant 114. In some embodiments, the semiconductor dies 21, 22 and the conductive bumps 110 are encapsulated by the insulating encapsulant 114. In some embodiments, a planarization process, including grinding or polishing, may be performed to partially remove the insulating encapsulant 114, exposing backside surfaces 21S, 22S of the semiconductor dies 21, 22. Accordingly, the backside surfaces 21S, 22S of the semiconductor dies 21, 22 are levelled with a surface 114*a* of the insulating encapsulant 114. The surface 114*a* being opposite to a surface 114*b* of the insulating encapsulant 114, wherein the surface 114*b* is in contact with the core substrate 102.

In some embodiments, a material of the insulating encapsulant 114 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulant 114 may include an acceptable insulating encapsulation material. In some embodiments, the insulating encapsulant 114 may further include inorganic filler or inorganic compound (e.g. silica, clay, and so on) which can be added therein to optimize coefficient of thermal expansion (CTE) of the insulating encapsulant 114. The disclosure is not limited thereto.

Figure 1D:
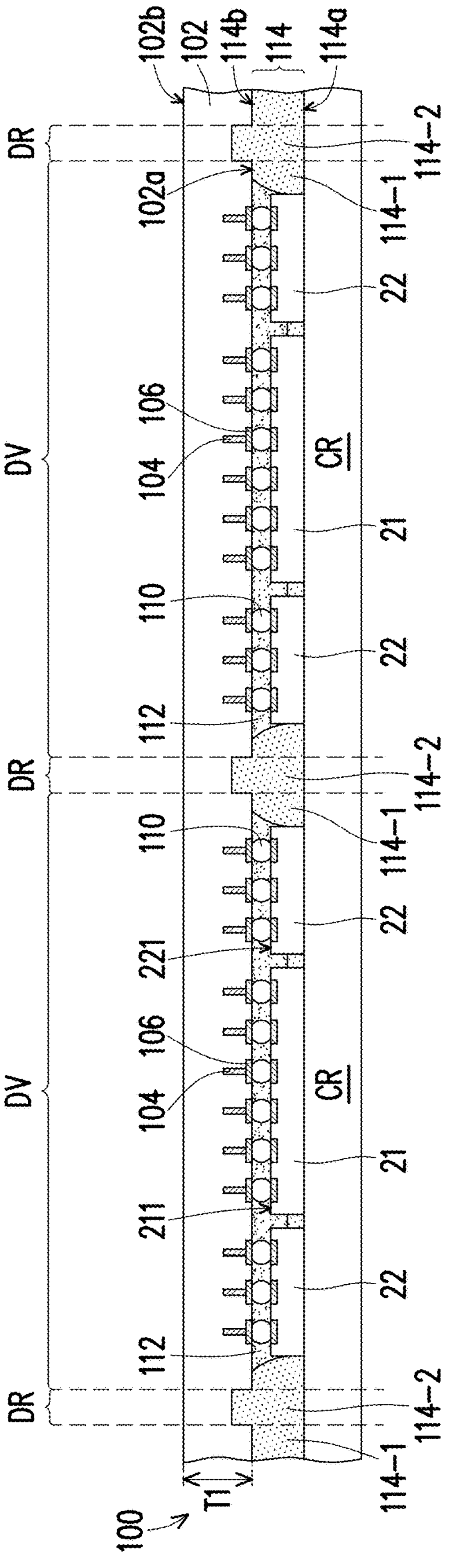

Referring to FIG. 1D, the structure shown in FIG. 1C is turned upside down or flipped, and placed on a carrier CR, so that the carrier CR directly contacts the backside surfaces 21S, 22S of the semiconductor dies 21, 22 and the surface 114*a* of the insulating encapsulant 114. As illustrated in FIG. 1C, at this stage of processing, the interposer structure 100 (interconnection structure) has not been thinned and has a thickness T1. In other words, the through vias 104 are not revealed, and are embedded in the core substrate 102 of the interposer structure 100.

Figure 1E:
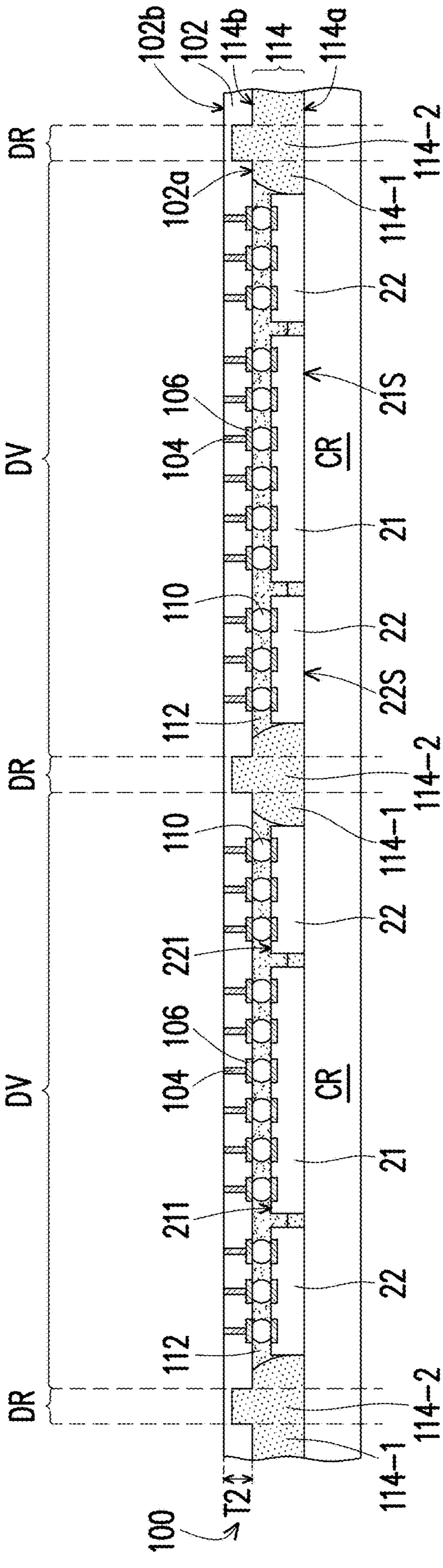

Referring to FIG. 1E, a thinning process is performed to the interposer structure 100 to partially remove or thin the core substrate 102 of the interposer structure 100 until the through vias 104 are exposed and a second surface 102*b* of the core substrate 102 is formed. In some embodiments, the thinning process may include a back-grinding process, a polishing process or an etching process. In some embodiments, after the thinning process, the interposer structure 100 is thinned to a thickness T2. In some embodiments, a ratio of the thickness T2 to the thickness T1 ranges from about 0.1 to about 0.5.

Figure 1F:
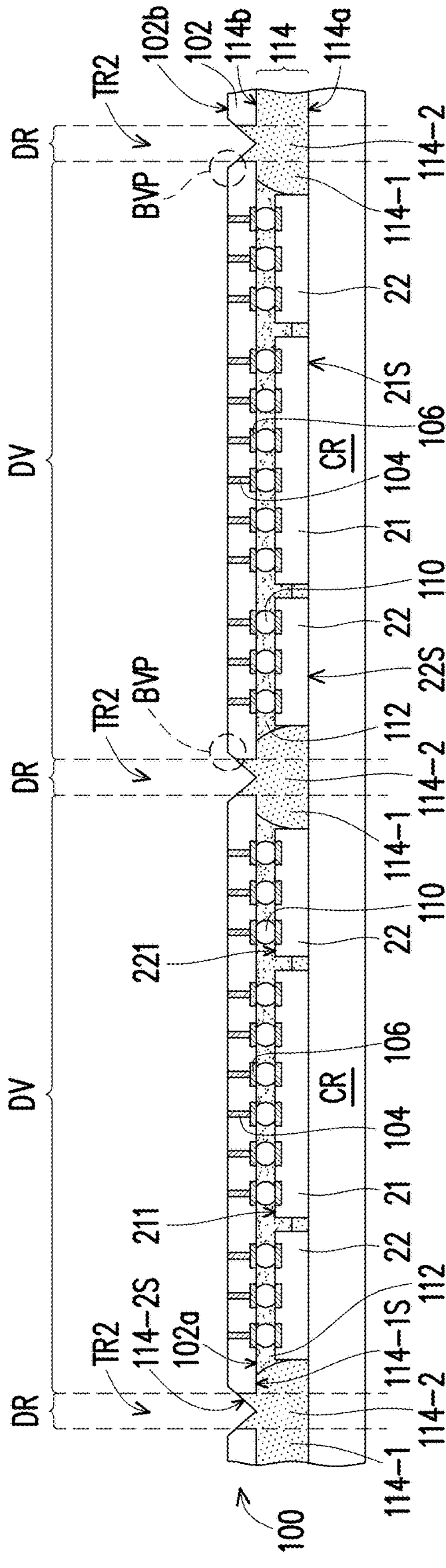

Referring to FIG. 1F, in a next step, a first dicing process is performed by removing portions of the interposer structure 100 (interconnection structure) and portions of the insulating encapsulant 114 to form a second trench TR2 on the second surface 102*b* of the interposer structure 100 in the dicing region DR. In certain embodiments, the second protruding portion 114-2 of the insulating encapsulant 114 and corners of the core substrate 102 are partially removed to form the second trench TR2. As illustrated in FIG. 1F, the second trench TR2 is a beveled trench having a V-shaped profile (when viewed from a cross section). In some embodiments, the corners of the core substrate 102 are removed so that the core substrate 102 includes a beveled portion BVP. Furthermore, the second protruding portion 114-2 of the insulating encapsulant 114 is removed so that it has a beveled top surface 114-2S. For example, the beveled top surface 114-2S is aligned with a surface of the beveled portion BVP. In some embodiments, the first portion 114-1 of the insulating encapsulant 114 has a planar top surface 114-1S that is in contact with the first surface 102*a* (or backside surface) of the interposer structure 100.

Figure 1G:
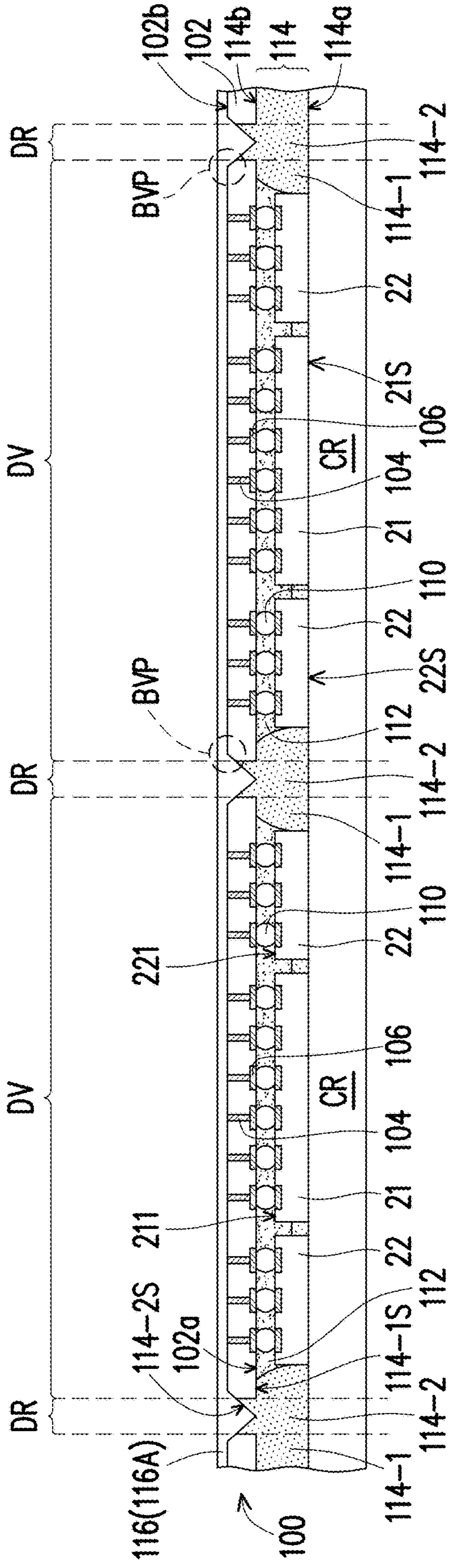

Referring to FIG. 1G, after forming the second trench TR2, a protection layer 116 is formed over the device regions DV and the dicing region DR on the second surface 102*b* (or top surface) of the interposer structure 100. In the exemplary embodiment, the protection layer 116 includes a polymer layer or dielectric material layer 116A. For example, the polymer layer or dielectric material layer 116A fills into the second trench TR2 and is in physical contact with the insulating encapsulant 114. In certain embodiments, the polymer layer or dielectric material layer 116A covers the beveled portion BVP of the core substrate 102 and covers the second protruding portion 114-2 (the beveled top surface 114-2S) of the insulating encapsulant 114. The polymer layer or dielectric material layer 116A may be a polyimide layer, a polybenzoxazole (PBO) layer, a benzocyclobutene (BCB) layer, or other suitable polymer or dielectric layers. In some embodiments, polymer layer or dielectric material layer 116A and the core substrate 102 are made of different materials. In certain embodiments, the polymer layer or dielectric material layer 116A may be formed by spin-coating or deposition, including chemical vapor deposition (CVD), plasma-enhanced CVD (PECVD), high-density plasma CVD (HDP-CVD), or the like.

Figure 1H:
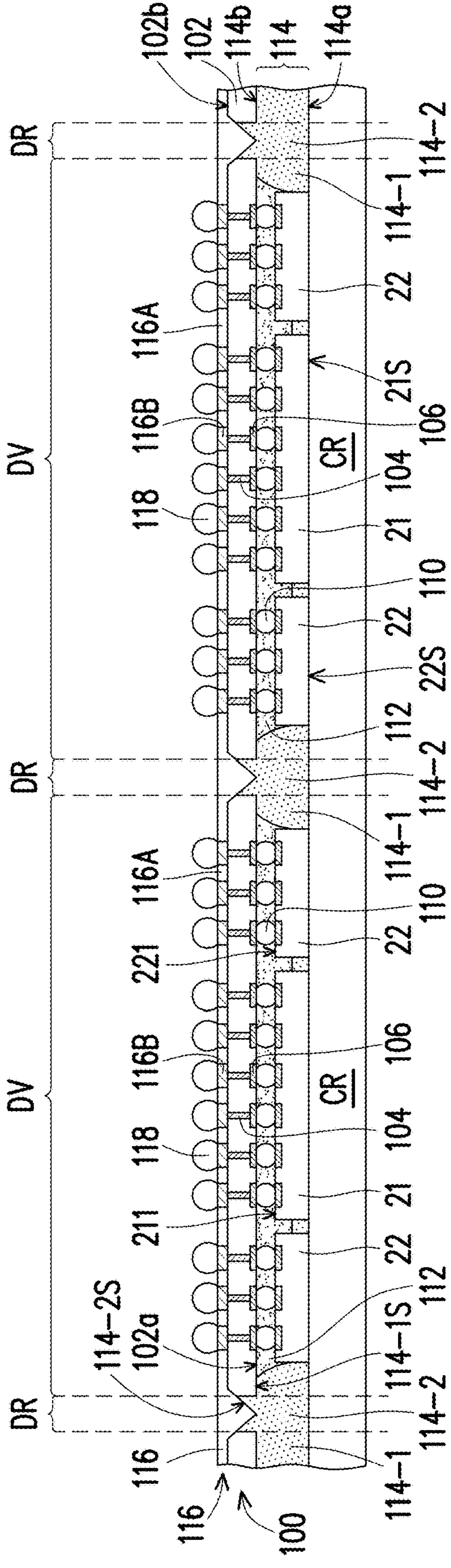

Referring to FIG. 1H, in a next step, the polymer layer or dielectric material layer 116A may be patterned using photolithography techniques and using one or more etching processes to form openings revealing the through vias 104. Thereafter, a plurality of conductive patterns 116B may be filled within the openings and being electrically connected to the through vias 104. Any excessive conductive materials on the dielectric material layer 116A may be removed, such as by using a chemical mechanical polishing process. In the exemplary embodiment, the dielectric material layer 116A and the conductive patterns 116B together constitute the protection layer 116. In some embodiments, the conductive patterns 116B are embedded within the dielectric material layer 116A. In certain embodiments, the conductive patterns 116B includes copper, aluminum, tungsten, silver, or combinations thereof.

As further illustrated in FIG. 1H, a plurality of electrical connectors 118 is disposed on the conductive patterns 116B, and are electrically coupled to the through vias 104. In some embodiments, the electrical connectors 118 are placed on the top surface of the protection layer 116, and electrically connected to the through vias 104 by the conductive patterns 116B within the device region DV. In certain embodiments, the electrical connectors 118 are positioned on and physically attached to the conductive patterns 116B. In some embodiments, the electrical connectors 118 include lead-free solder balls, solder balls, ball grid array (BGA) balls, bumps, C4 bumps or micro bumps. In some embodiments, the electrical connectors 118 may include a conductive material such as solder, copper, aluminum, gold, nickel, silver, palladium, tin, or a combination thereof. In some embodiments, the electrical connectors 118 are formed by forming the solder paste on the protection layer 116 by, for example, evaporation, electroplating, printing or solder transfer and then reflowed into the desired bump shapes. In some embodiments, the electrical connectors 118 are placed on the protection layer 116 by ball placement or the like. In other embodiments, the electrical connectors 118 are formed by forming solder-free metal pillars (such as a copper pillar) by sputtering, printing, electroless or electro plating or CVD, and then forming a lead-free cap layer by plating on the metal pillars. The electrical connectors 118 may be used to bond to an external device or an additional electrical component. In some embodiments, the electrical connectors 118 are used to bond to a circuit substrate, a semiconductor substrate or a packaging substrate.

Figure 1I:
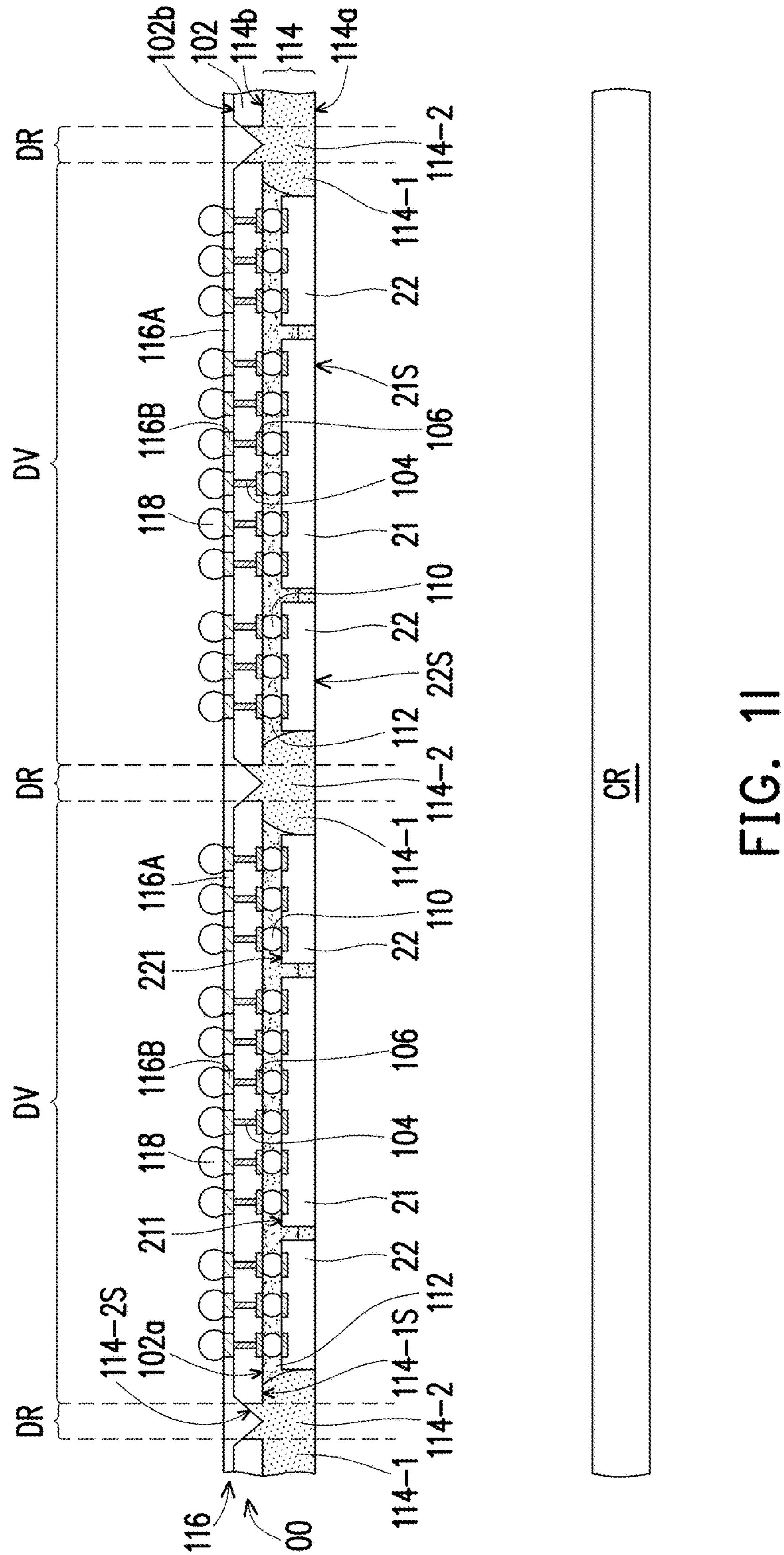
Figure 1J:
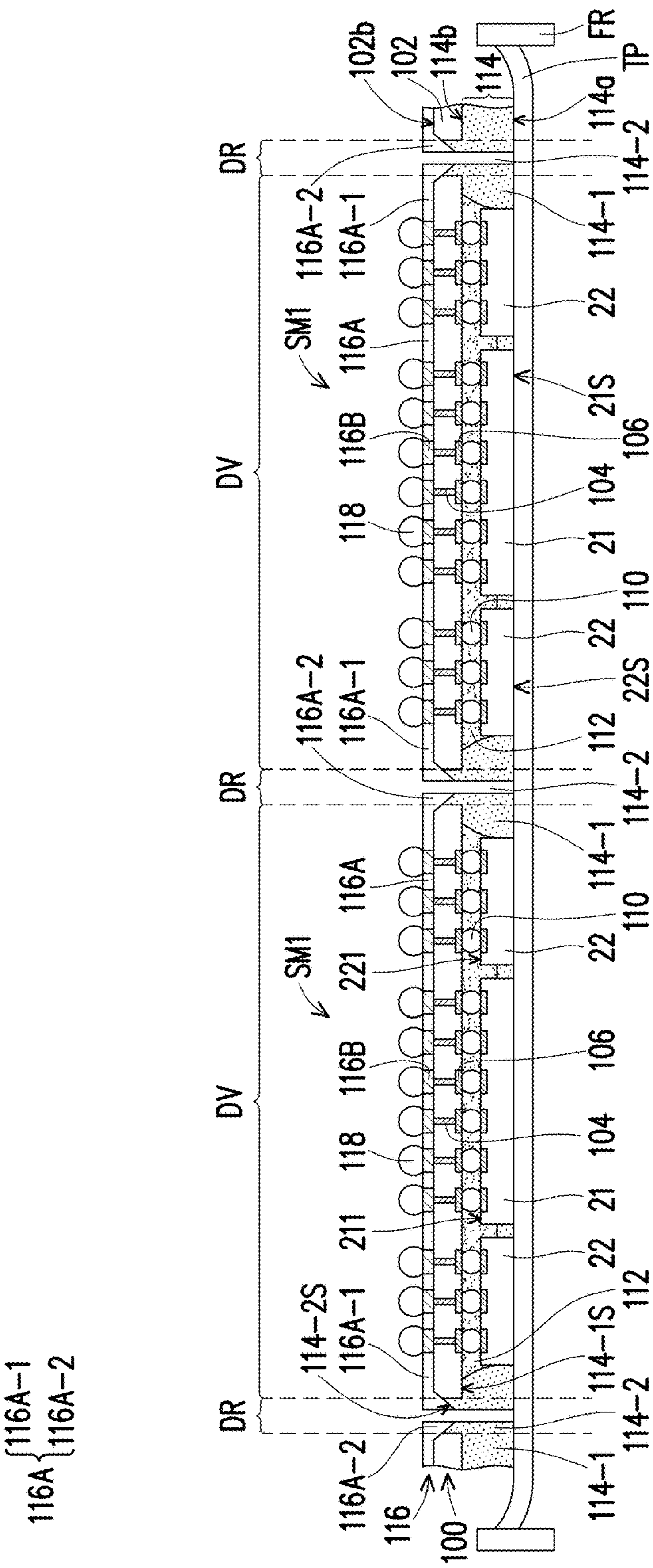

As illustrated in FIG. 1I, in a subsequent step, the carrier CR is de-bonded. For example, the de-bonding process includes projecting a light such as a laser light or an UV light on a debond layer (e.g., light-to-heat-conversion release layer) that is attached to the carrier CR (not shown), so that the carrier CR can be easily removed along with the debond layer. As illustrated in FIG. 1J, after de-bonding the carrier CR, the structure shown in FIG. 1I is attached to a tape TP (e.g., a dicing tape) supported by a frame FR. Thereafter, a second dicing process is performed to cut through the protection layer 116 and the insulating encapsulant 114 in the dicing region DR. In some embodiments, the dicing process or the singulation process typically involves dicing with a rotating blade or a laser beam. In other words, the dicing or singulation process is, for example, a laser cutting process, a mechanical sawing process, or other suitable processes. After the second dicing process, the singulated semiconductor device SM1 illustrated in FIG. 1K can be obtained.

Figure 1K:
Figure 1K:
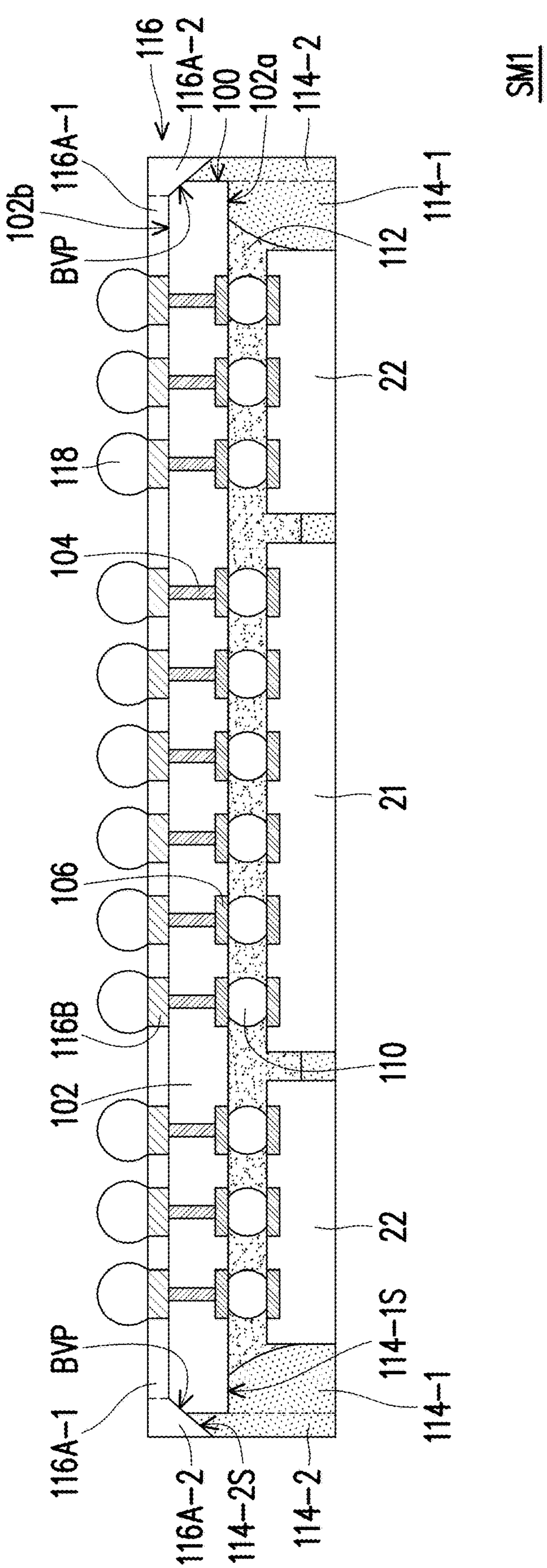

As illustrate in FIG. 1K, after the second dicing process, the insulating encapsulant 114 is formed to partially cover the sidewalls of the interposer structure 100 (interconnection structure), while the protection layer 116 partially covers the remaining sidewalls of the interposer structure 100. In some embodiments, the protection layer 116 or the polymer layer/dielectric material layer 116A is formed with a central portion 116A-1 and a flank portion 116A-2 connected to the central portion 116A-1. In some embodiments, the central portion 116A-1 is formed to cover and physically contact the second surface 102*b* (top surface) of the interposer structure 100 (interconnection structure). In certain embodiments, the flank portion 116A-2 is surrounding the central portion 116A-1 and protrudes out from the central portion 116A-1. Furthermore, the flank portion 116A-2 of the protection layer 116 is covering and physically contacting the beveled portion BVP of the core substrate 102.

As further illustrated in FIG. 1K, in the singulated semiconductor device SM1, the first portion 114-1 of the insulating encapsulant 114 is surrounding the semiconductor dies 21,22, and the second protruding portion 114-2 is surrounding the first portion 114-1 and partially surrounding the interposer structure 100 (interconnection structure). In some embodiments, the first portion 114-1 of the insulating encapsulant 114 has a planar top surface 114-1S in contact with the core substrate 102 of the interposer structure 100 (interconnection structure), while the second protruding portion 114-2 of the insulating encapsulant 114 has a beveled top surface 114-2S in contact with the flank portion 116A-2 of the protection layer 116. In addition, side surfaces of the flank portion 116A-2 of the protection layer 116 are aligned with side surfaces of the second protruding portion 114-2 of the insulating encapsulant 114. Up to here, a semiconductor device SM1 according to some exemplary embodiment is accomplished.

Figure 2A:
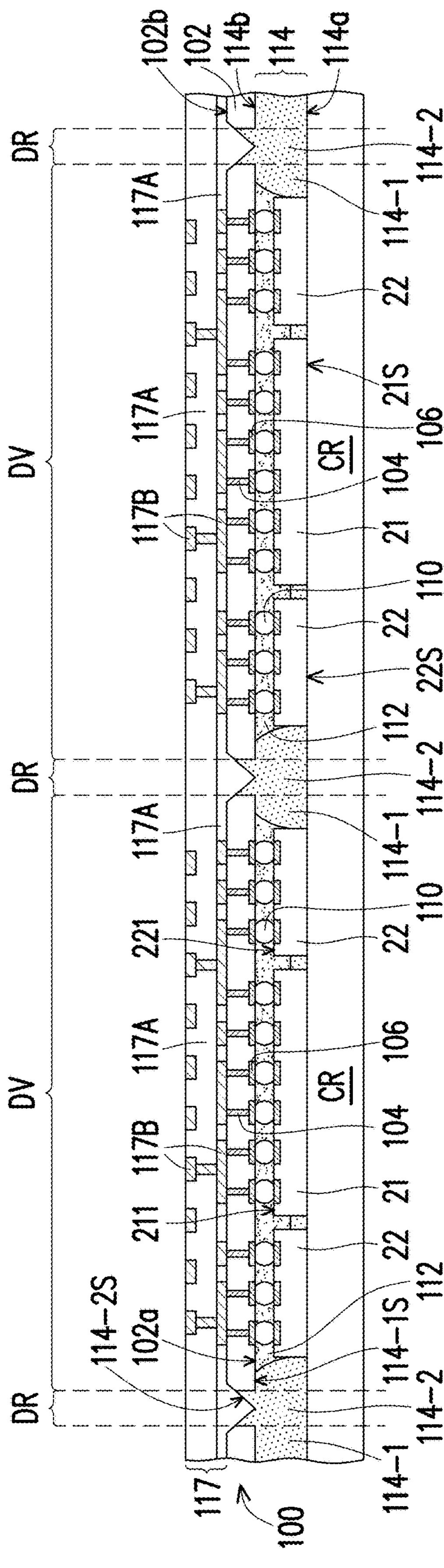
FIG. 2A to FIG. 2C are schematic sectional views of various stages in a method of fabricating a semiconductor device according to some other exemplary embodiments of the present disclosure.
Figure 2B:
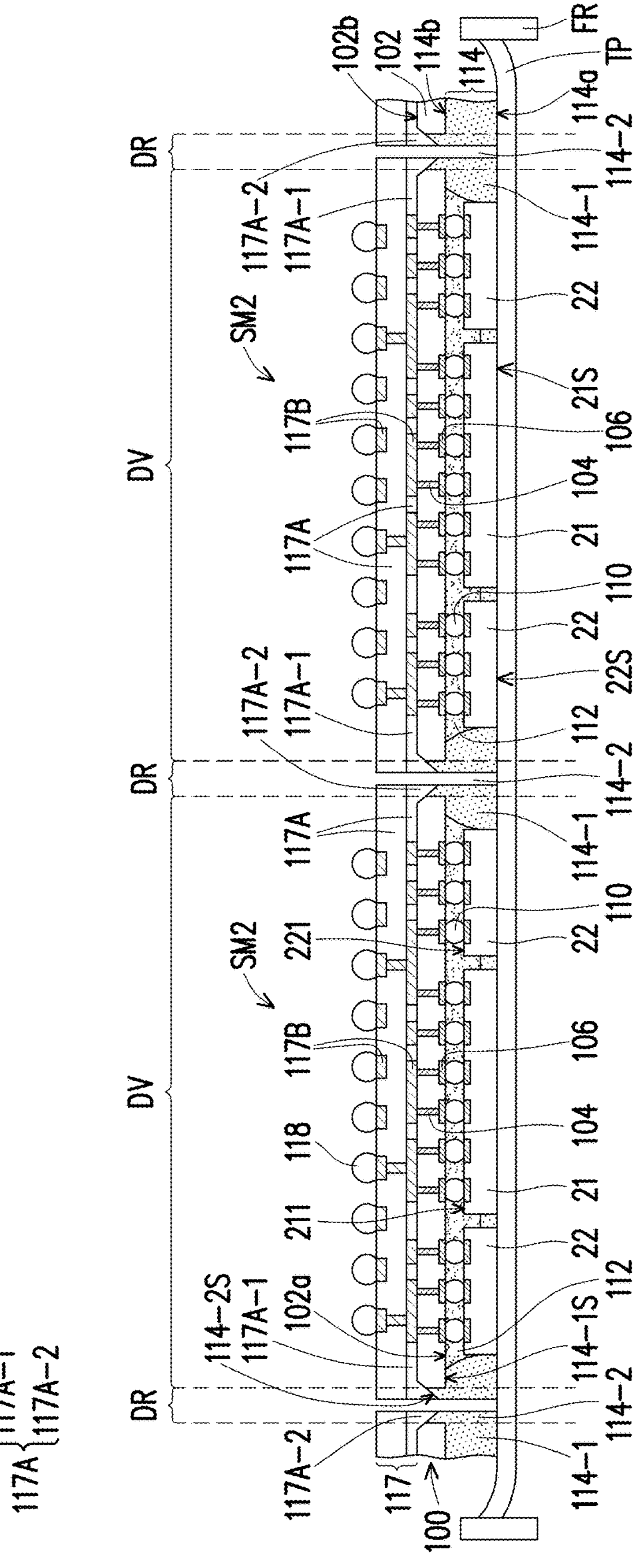
Figure 2C:
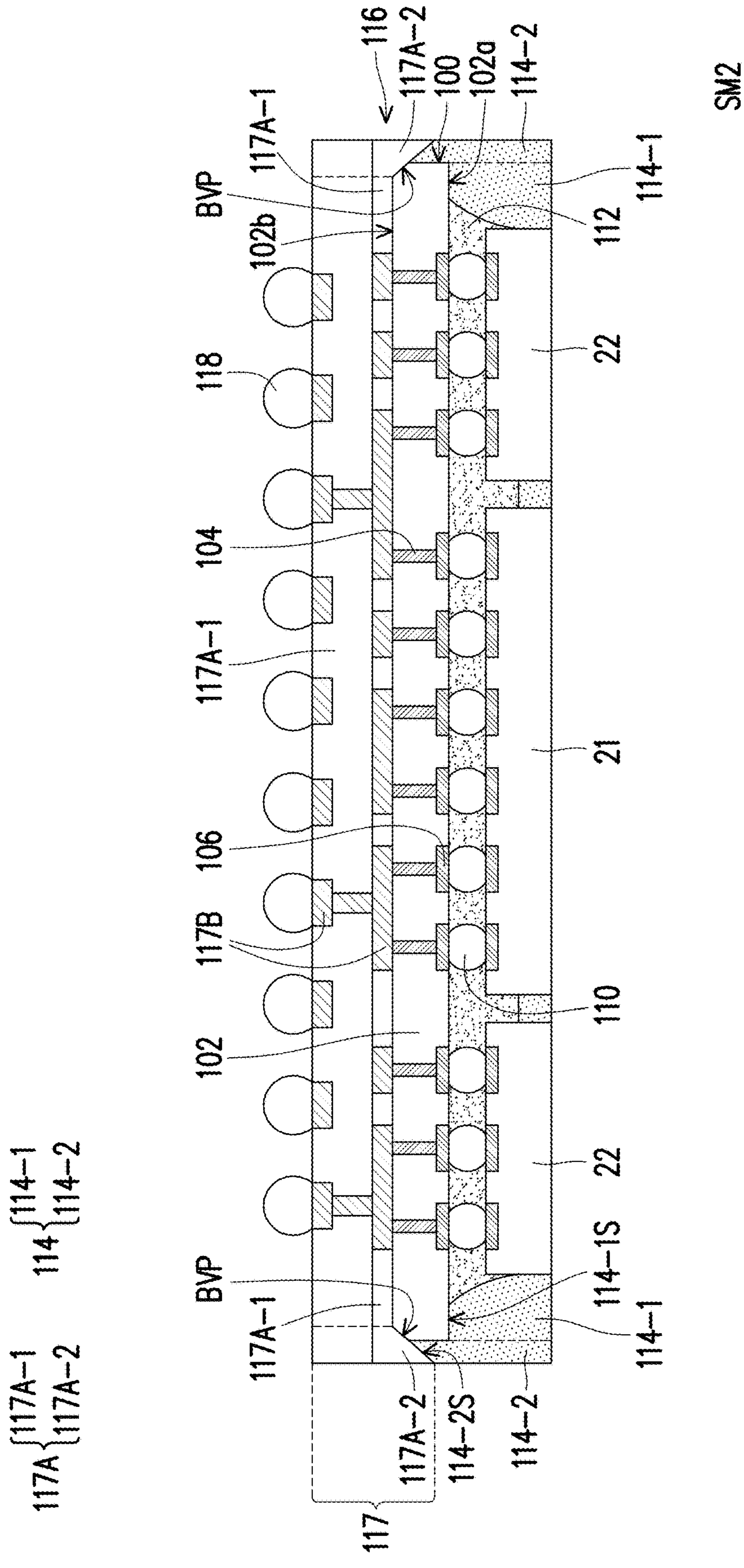

FIG. 2A to FIG. 2C are schematic sectional views of various stages in a method of fabricating a semiconductor device according to some other exemplary embodiments of the present disclosure. The method illustrated in FIG. 2A to FIG. 2C is similar to the method illustrated in FIG. 1A to FIG. 1K. Therefore, the same reference numerals will be used to refer to the same or liked parts, and its detailed description will not be repeated herein. The difference between the methods is in the design of the protection layer (116/117).

As illustrated in FIG. 1H, the protection layer 116 is shown to include one layer of polymer layer/dielectric material layer 116A and one layer of conductive patterns 116B. However, the disclosure is not limited thereto, and the number of polymer layer/dielectric material layer 116A and conductive patterns 116B may be adjusted based on product requirement.

For example, as illustrated in FIG. 2A, after the step of forming the second trench TR2 shown in FIG. 1F, a protection layer 117 having a plurality of polymer layers/dielectric material layers 117A and a plurality of layers of conductive patterns 117B alternately stacked is formed over the interposer structure 100. In some embodiments, the polymer layers/dielectric material layers 117A are formed to fill into the second trench TR2. In some embodiments, the conductive patterns 117B may comprise pads, vias and/or trace lines to interconnect the through vias 104 of the interposer structure 100. In certain embodiments, the protection layer 117 is a redistribution layer that electrically connects the semiconductor dies 21, 22 and the through vias 104 with one or more external devices. The materials of the polymer layers/dielectric material layers 117A and conductive patterns 117B are similar to the polymer layers/dielectric material layers 116A and conductive patterns 116B mentioned above. Thus, their details are omitted herein.

Referring to FIG. 2B, after forming the protection layer 117, the same steps described in FIG. 1H to FIG. 1J may be performed. For example, a plurality of electrical connectors 118 is disposed on the conductive patterns 117B, and are electrically coupled to the through vias 104 through the conductive patterns 117B. Thereafter, the carrier CR may be debonded, and the entire structure is attached to a tape TP (e.g., a dicing tape) supported by a frame FR. Subsequently, a dicing process (second dicing process) is performed to cut through the protection layer 117 and the insulating encapsulant 114 in the dicing region DR. For example, the dicing process may cut through the plurality of polymer layers/dielectric material layers 117A. After the dicing process, the singulated semiconductor device SM2 illustrated in FIG. 2C can be obtained.

As illustrated in FIG. 2C, in the singulated semiconductor device SM2, the insulating encapsulant 114 is formed to partially cover the sidewalls of the interposer structure 100 (interconnection structure), while the protection layer 117 (bottommost polymer layer/dielectric material layer 117A) partially covers the remaining sidewalls of the interposer structure 100. In some embodiments, the protection layer 117 or the bottommost polymer layer/dielectric material layer 117A is formed with a central portion 117A-1 and a flank portion 117A-2 connected to the central portion 117A-1. In some embodiments, the central portion 117A-1 is formed to cover and physically contact the second surface 102*b* (top surface) of the interposer structure 100 (interconnection structure). In certain embodiments, the flank portion 117A-2 is surrounding the central portion 117A-1 and protrudes out from the central portion 117A-1. Furthermore, the flank portion 117A-2 of the protection layer 117 is covering and physically contacting the beveled portion BVP of the core substrate 102.

Similarly, as further illustrated in FIG. 2C, the first portion 114-1 of the insulating encapsulant 114 is surrounding the semiconductor dies 21,22, and the second protruding portion 114-2 is surrounding the first portion 114-1 and partially surrounding the interposer structure 100 (interconnection structure). In some embodiments, the first portion 114-1 of the insulating encapsulant 114 has a planar top surface 114-1S in contact with the core substrate 102 of the interposer structure 100 (interconnection structure), while the second protruding portion 114-2 of the insulating encapsulant 114 has a beveled top surface 114-2S in contact with the flank portion 117A-2 of the protection layer 117. In addition, side surfaces of the flank portion 117A-2 of the protection layer 117 are aligned with side surfaces of the second protruding portion 114-2 of the insulating encapsulant 114. Up to here, a semiconductor device SM2 according to some exemplary embodiment is accomplished.

FIG. 3A to FIG. 3D are schematic sectional views of various stages in a method of fabricating a semiconductor device according to some other exemplary embodiments of the present disclosure. The method illustrated in FIG. 3A to FIG. 3D is similar to the method illustrated in FIG. 1A to FIG. 1K. Therefore, the same reference numerals will be used to refer to the same or liked parts, and its detailed description will not be repeated herein. The difference between the methods is in the design of the interposer structure 100.

In the embodiment illustrated in FIG. 1G, the second trench TR2 is formed by removing corners of the core substrate 102 so that the core substrate 102 includes a beveled portion BVP. However, the disclosure is not limited thereto. In an alternative embodiment shown in FIG. 3A, the second trench TR2 is formed by a first dicing process by removing portions of the core substrate 102 so that interposer structure 100 includes a beveled portion BVP protruding out from the core substrate 102. Furthermore, in the exemplary embodiment, besides having a first portion 114-1 and a second protruding portion 114-2, the insulating encapsulant 114 may further include a third protruding portion 114-3 located in between the first portion 114-1 and the second portion 114-2 within the dicing region DR. In some embodiment, the second trench TR2 is formed by partially removing the second protruding portion 114-2 in the dicing region DR, while the first portion 114-1 and the third protruding portion 114-3 are retained.

Figure 3A:
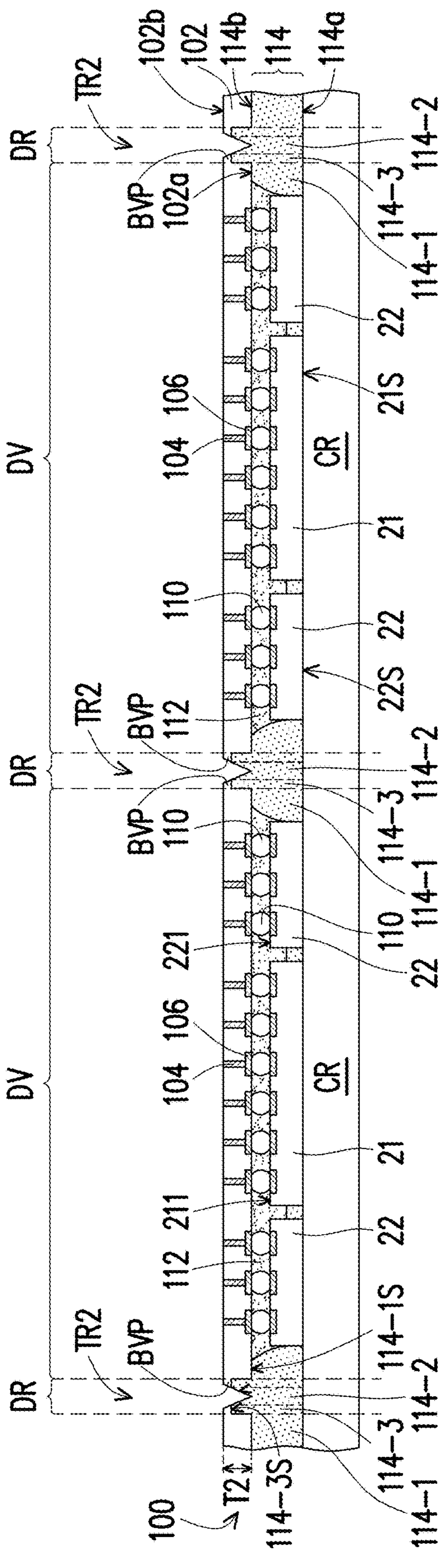
FIG. 3A to FIG. 3D are schematic sectional views of various stages in a method of fabricating a semiconductor device according to some other exemplary embodiments of the present disclosure.

Referring to FIG. 3A, after the first dicing process, the first portion 114-1 of the insulating encapsulant 114 has a planar top surface 114-1S that is in contact with the first surface 102*a* (or backside surface) of the interposer structure 100. The second protruding portion 114-2 has a beveled top surface 114-2S that is aligned with a surface of the beveled portion BVP. Additionally, the third protruding portion 114-2 is joining the first portion 114-1 to the second protruding portion 114-2, and has a planar top surface 114-3S that is in contact with a surface of the protruded beveled portion BVP of the interposer structure 100.

Figure 3B:
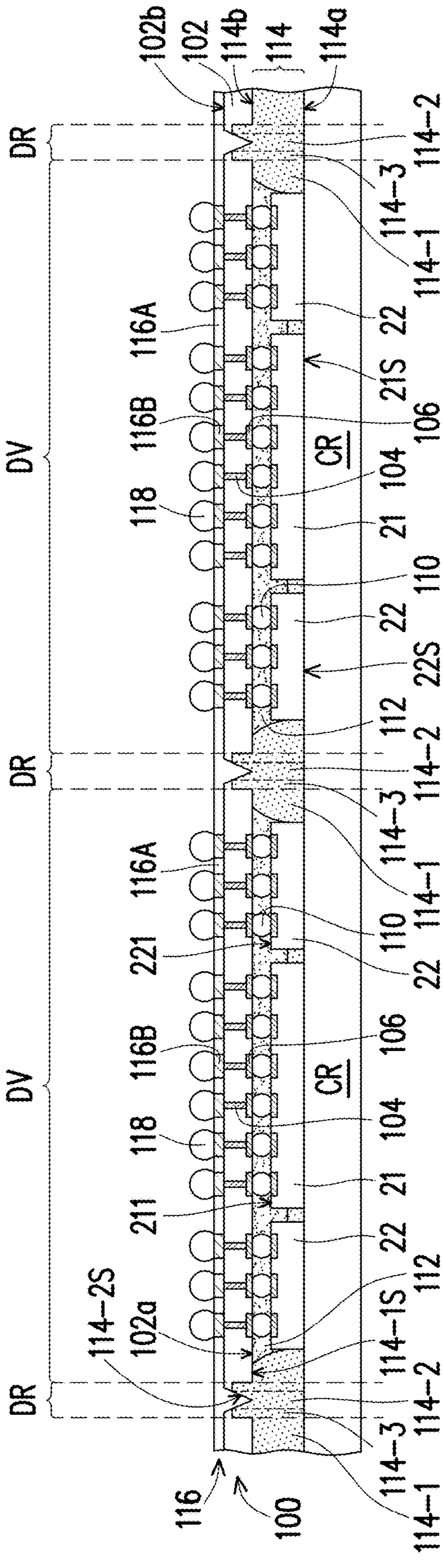

Referring to FIG. 3B, after forming the second trench TR2, the same steps described in FIG. 1G to FIG. 1J may be performed. For example, a protection layer 116 including a polymer layer or dielectric material layer 116A and conductive patterns 116B embedded in the polymer layer or dielectric material layer 116A may be formed over the interposer structure 100. Subsequently, a plurality of electrical connectors 118 is disposed on the conductive patterns 116B, and are electrically coupled to the through vias 104 through the conductive patterns 116B.

Figure 3C:
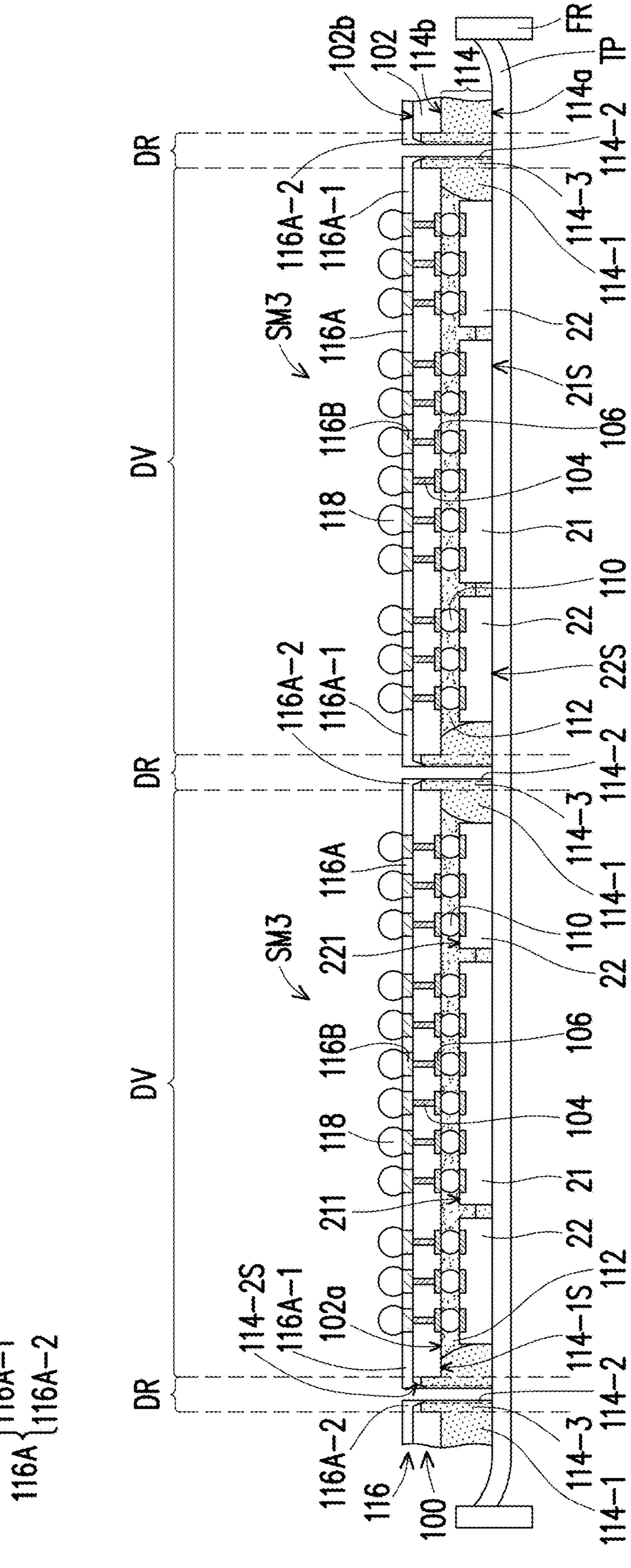

Referring to FIG. 3C, in a next step, the carrier CR may be debonded, and the entire structure is attached to a tape TP (e.g., a dicing tape) supported by a frame FR. Subsequently, a dicing process (second dicing process) is performed to cut through the protection layer 116 and the insulating encapsulant 114 in the dicing region DR. For example, the dicing process may cut through the polymer layer/dielectric material layer 116A of the protection layer 116, and cut through the second protruding portion 114-2 of the insulating encapsulant 114. After the dicing process, the singulated semiconductor device SM3 illustrated in FIG. 3D can be obtained.

Figure 3D:
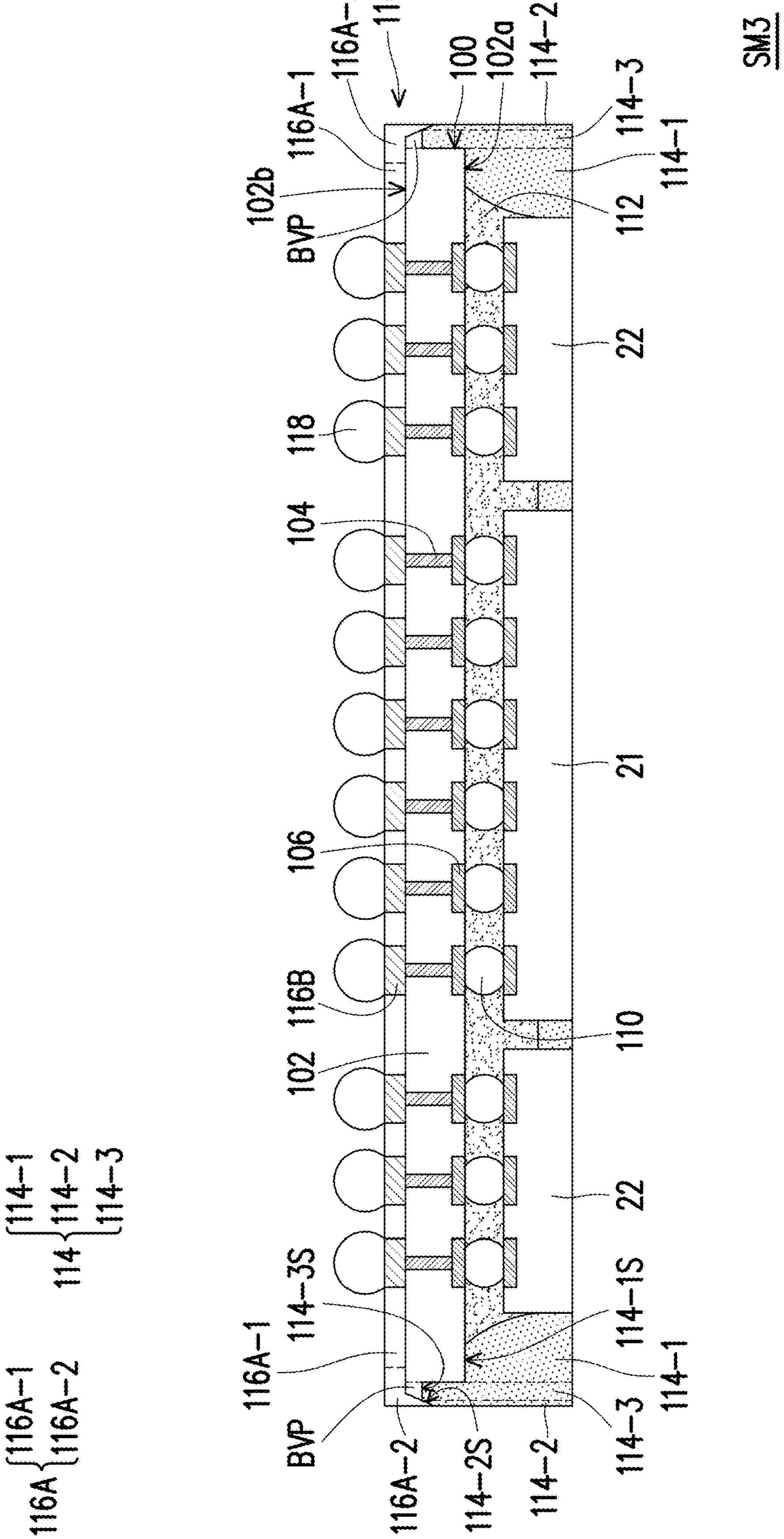

As illustrated in FIG. 3D, in the singulated semiconductor device SM3, the insulating encapsulant 114 (third protruding portion 114-3) is formed to partially cover the sidewalls of the interposer structure 100 (interconnection structure), while the protection layer 116 covers the remaining sidewalls (sidewalls of beveled portion BVP) of the interposer structure 100. In some embodiments, the protection layer 116 is formed with a central portion 116A-1 and a flank portion 116A-2 connected to the central portion 116A-1. In some embodiments, the central portion 116A-1 is formed to cover and physically contact the second surface 102*b* (top surface) of the interposer structure 100 (interconnection structure). In certain embodiments, the flank portion 116A-2 is surrounding the central portion 116A-1 and protrudes out from the central portion 116A-1. Furthermore, the flank portion 116A-2 of the protection layer 116 is covering and physically contacting the protruded beveled portion BVP of the interposer structure 100.

Similarly, as further illustrated in FIG. 3D, the first portion 114-1 of the insulating encapsulant 114 is surrounding the semiconductor dies 21,22, and the second protruding portion 114-2 is surrounding the first portion 114-1 and partially surrounding the interposer structure 100 (interconnection structure). Furthermore, the third protruding portion 114-3 is located in between the first portion 114-1 and the second protruding portion 114-2, partially surrounding the interposer structure 100, and joining the first portion 114-1 to the second protruding portion 114-2. In some embodiments, the first portion 114-1 of the insulating encapsulant 114 has a planar top surface 114-1S in contact with the core substrate 102 of the interposer structure 100 (interconnection structure), while the second protruding portion 114-2 of the insulating encapsulant 114 has a beveled top surface 114-2S in contact with the flank portion 116A-2 of the protection layer 116. In some embodiments, side surfaces of the flank portion 116A-2 of the protection layer 116 are aligned with side surfaces of the second protruding portion 114-2 of the insulating encapsulant 114. In addition, the third protruding portion 114-3 has a planar top surface 114-3S that is in contact with a surface of the protruded beveled portion BVP. The planar top surface 114-3S has a step height difference with the planar top surface 114-1S, and the planar top surface 114-3S is joined to the beveled top surface 114-2S. Up to here, a semiconductor device SM3 according to some exemplary embodiment is accomplished.

Figure 4A:
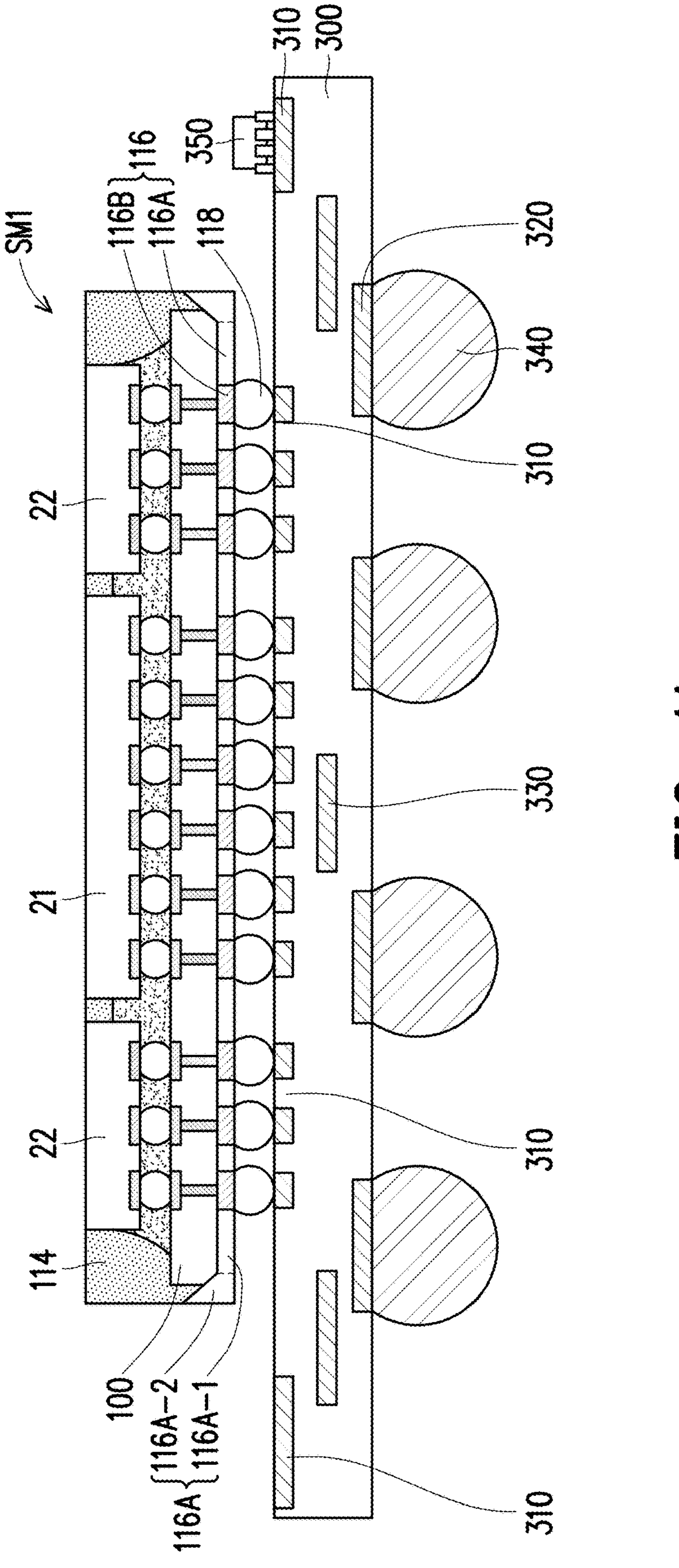
FIG. 4A and FIG. 4B are schematic sectional views of various stages in a method of fabricating a package structure according to some exemplary embodiments of the present disclosure.
Figure 4B:
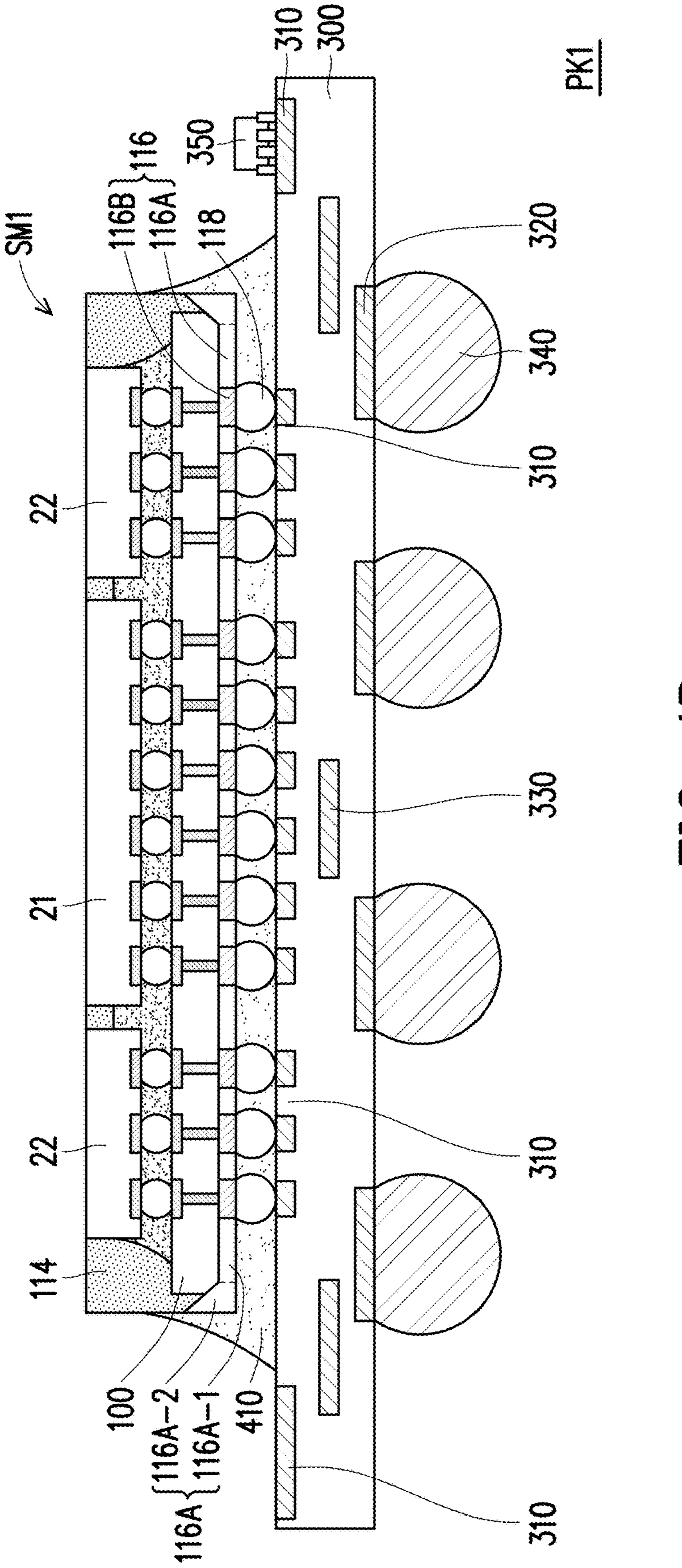

FIG. 4A and FIG. 4B are schematic sectional views of various stages in a method of fabricating a package structure according to some exemplary embodiments of the present disclosure. As illustrated in FIG. 4A, in the exemplary embodiment, the semiconductor device SM1 obtained in FIG. 1K is mounted or attached onto a circuit substrate 300 through the electrical connectors 118. In some embodiments, the circuit substrate 300 include contact pads 310, contact pads 320, metallization layers 330, and vias (not shown). In some embodiments, the contact pads 310 and the contact pads 320 are respectively distributed on two opposite sides of the circuit substrate 300, and are exposed for electrically connecting with later-formed elements/features. In some embodiments, the metallization layers 330 and the vias are embedded in the circuit substrate 300 and together provide routing function for the circuit substrate 300, wherein the metallization layers 330 and the vias are electrically connected to the contact pads 310 and the contact pads 320. In other words, at least some of the contact pads 310 are electrically connected to some of the contact pads 320 through the metallization layers 330 and the vias. In some embodiments, the contact pads 310 and the contact pads 320 may include metal pads or metal alloy pads. In some embodiments, the materials of the metallization layers 330 and the vias may be substantially the same or similar to the material of the contact pads 310 and the contact pads 320.

In the exemplary embodiment, as illustrated in FIG. 4A, the semiconductor device SM1 is bonded to the circuit substrate 300 through physically connecting the electrical connectors 118 and the contact pads 310 to form a stacked structure, where the semiconductor device SM1 is physically and electrically connected to the circuit substrate 300. In some embodiments, the circuit substrate 300 is such as an organic flexible substrate or a printed circuit board. In such embodiments, the electrical connectors 118 are, for example, chip connectors. In some embodiments, a plurality of conductive balls 340 are respectively formed on the substrate 300. As shown in FIG. 4A, for example, the conductive balls 340 are connected to the contact pads 320 of the circuit substrate 300. In other words, the conductive balls 340 are electrically connected to the circuit substrate 300 through the contact pads 320. Through the contact pads 310 and the contact pads 320, some of the conductive balls 340 are electrically connected to the semiconductor device SM1 (e.g. the semiconductor dies 21 and 22 included therein). In some embodiments, the conductive balls 340 are, for example, solder balls or BGA balls. In some embodiments, the semiconductor device SM1 is bonded to the circuit substrate 300 through physically connecting the electrical connectors 118 and the contact pads 310 of the circuit substrate 300 by a chip on wafer on substrate (CoWoS) packaging processes. In addition, as illustrated in FIG. 4A, one or more passive component 350 (or integrated passive device) may be mounted on the circuit substrate 300. For example, the passive component 350 may be mounted on the contact pads 310 of the circuit substrate 300 through a soldering process. The disclosure is not limited thereto.

Referring to FIG. 4B, in a next step, an underfill structure 410 is formed to fill up the spaces in between the circuit substrate 300 and the semiconductor device SM1. In some embodiments, the underfill structure 410 fills up the spaces in between adjacent electrical connectors 118 and covers the electrical connectors 118. In some embodiments, the underfill structure 410 covers and is in physical contact with the protection layer 116. In some embodiments, the underfill structure 410 further covers and physically contact sidewalls of the insulating encapsulant 114. Furthermore, the underfill structure 410 is physically separated from the interposer structure 100. In other words, the interposer structure 100 (or interconnection structure) is isolated in the semiconductor device SM1 by the protection layer 116 and the insulating encapsulant 114, and is not revealed at outer surfaces of the semiconductor device SM1. Furthermore, the passive component 350 is exposed by the underfill structure 410, and kept a distance apart from the underfill structure 410. In other words, the underfill structure 410 does not cover the passive component 350. Up to here, a package structure PK1 according to some embodiments of the present disclosure is accomplished.

In the exemplary embodiment, since the package structure PK1 includes an insulating encapsulant 114 and a protection layer 116 surrounding and isolating the interposer structure 100 (or interconnection structure), the interposer structure 100 may be protected from outside components. For example, when the interposer structure 100 is a silicon interposer (coefficient of thermal expansion (CTE) being ~2.5 ppm/° C.), and when the underfill structure 410 is a thermoset epoxy material (CTE being 20 to 65 ppm/° C.), if the interposer structure 100 and the underfill structure 410 are made to contact one another, then a delamination issue and cracks on the underfill structure 410 may be observed due to CTE mismatch of the materials used. On the other hand, in some embodiments, when the interposer structure 100 is protected by at least the protection layer 116 (e.g. polyimide with CTE of 20 to 100 ppm/° C.), since the underfill structure 410 is in contact with the protection layer 116 having a similar CTE, the delamination issue and cracks on the underfill structure 410 due to CTE mismatch may be resolved.

Figure 5:
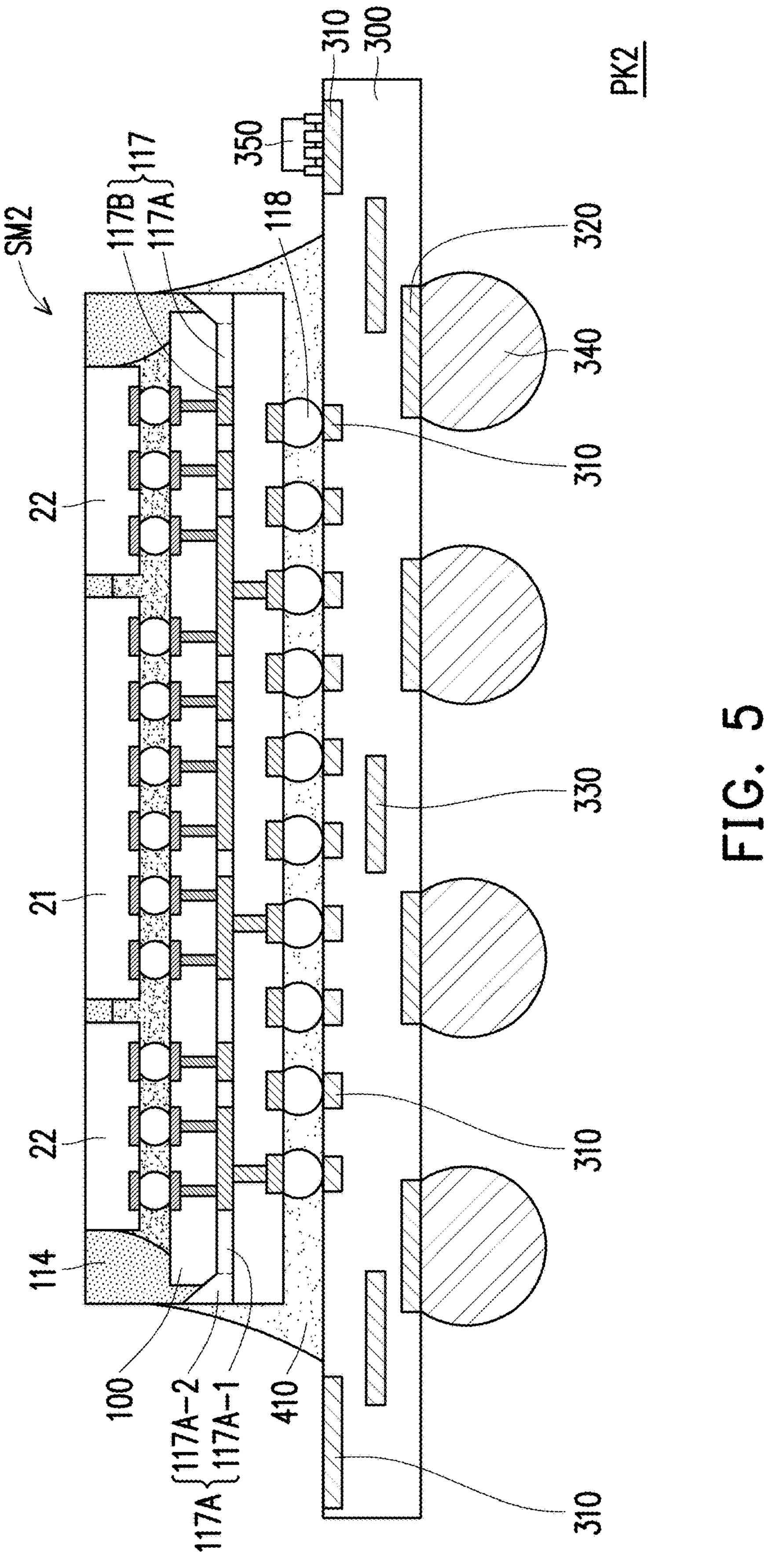
FIG. 5 is a schematic sectional view of a package structure according to some other exemplary embodiments of the present disclosure.

FIG. 5 is a schematic sectional view of a package structure according to some other exemplary embodiments of the present disclosure. The package structure PK2 illustrated in FIG. 5 is similar to the package structure PK1 illustrated in FIG. 4B. Therefore, the same reference numerals are used to refer to the same or liked parts, and its detailed description will not be repeated herein. The difference between the package structures is that the semiconductor device SM2 is used in replacement of the semiconductor device SM1 in FIG. 5.

As illustrated in FIG. 5, the semiconductor device SM2 obtained in FIG. 2C is mounted or attached onto a circuit substrate 300 through the electrical connectors 118. Thereafter, an underfill structure 410 is formed to fill up the spaces in between the circuit substrate 300 and the semiconductor device SM2. In some embodiments, the underfill structure 410 covers and is in physical contact with the protection layer 117. For example, the underfill structure 410 cover and contact sidewalls of the plurality of polymer layers/dielectric material layers 117A. In some embodiments, the underfill structure 410 further covers and physically contact sidewalls of the insulating encapsulant 114. In a similar way, the underfill structure 410 is physically separated from the interposer structure 100. In other words, the interposer structure 100 (or interconnection structure) is isolated in the semiconductor device SM2 by the protection layer 117 and the insulating encapsulant 114, and is not revealed at outer surfaces of the semiconductor device SM2. Up to here, a package structure PK2 according to some embodiments of the present disclosure is accomplished.

In the above-mentioned embodiments, since the package structure includes a semiconductor device having an insulating encapsulant and a protection layer surrounding and covering sidewalls of the interposer structure (interconnection structure), a protected interposer structure may be achieved. Therefore, the interposer structure may be isolated (or physically separated) from the underfill structure used in subsequent steps. As a result, a delamination issue and cracks on the underfill structure due to a mismatch in coefficient of thermal expansion (CTE) of the materials used for the interconnection structure and the underfill structure may be resolved. Overall, a package structure with better reliability can be obtained.

In accordance with some embodiments of the present disclosure, a package structure includes a circuit substrate and a semiconductor device. The semiconductor device is disposed on and electrically connected to the circuit substrate. The semiconductor device includes an interconnection structure, a semiconductor die, an insulating encapsulant, a protection layer and a plurality of electrical connectors. The interconnection structure has a first surface and a second surface opposite to the first surface. The semiconductor die is disposed on the first surface and electrically connected to the interconnection structure. The insulating encapsulant is disposed on the first surface of the interconnection structure and encapsulating the semiconductor die, wherein the insulating encapsulant partially covers sidewalls of the interconnection structure. The protection layer is disposed on the second surface of the interconnection structure and partially covering the sidewalls of the interconnection structure, wherein the protection layer is in contact with the insulating encapsulant. The electrical connectors are disposed on the protection layer, wherein the interconnection structure is electrically connected to the circuit substrate through the plurality of electrical connectors.

In accordance with some other embodiments of the present disclosure, a package structure includes a circuit substrate, an interposer structure, at least one semiconductor die, an insulating encapsulant, and a polymer layer. The interposer structure is disposed on the circuit substrate, wherein the interposer structure includes a core substrate and a plurality of through vias formed in the core substrate. The semiconductor die is disposed on a backside surface of the interposer structure, wherein the at least one semiconductor die is electrically connected to the plurality of through vias. The insulating encapsulant is disposed on the backside surface of the interposer structure and covering the semiconductor die. The polymer layer is disposed on a top surface of the interposer structure, wherein the polymer layer comprises a central portion and a flank portion connected to the central portion, the central portion is covering and in contact with the top surface of the interposer structure, the flank portion protrudes out from the central portion and is surrounding the interposer structure.

In accordance with yet another embodiment of the present disclosure, a method of fabricating a package structure is described. The method includes forming a semiconductor device by the following steps. An interconnection structure having a device region and a dicing region surrounding the device region is provided. A semiconductor die is disposed on a first surface of the interconnection structure within the device region, wherein the semiconductor die is electrically connected to the interconnection structure. A first trench is formed on the first surface of the interconnection structure within the dicing region, wherein the first trench surrounds the semiconductor die. An insulating encapsulant is formed over the device region and the dicing region on the first surface of the interconnection structure, wherein the insulating encapsulant encapsulates the semiconductor die and fills into the first trench. A first dicing process is performed by removing portions of the interconnection structure and portions of the insulating encapsulant to form a second trench on a second surface of the interconnection structure in the dicing region, the second surface being opposite to the first surface. A protection layer is formed over the device region and the dicing region on the second surface of the interconnection structure, wherein the protection layer fills into the second trench and is in contact with the insulating encapsulant. A plurality of electrical connectors is formed on the protection layer, wherein the plurality of electrical connectors is electrically connected to the interconnection structure. A second dicing process is performed by cutting through the protection layer and the insulating encapsulant, wherein the insulating encapsulant partially covers sidewalls of the interconnection structure and the protection layer partially covers the sidewalls of the interconnection structure after the second dicing process. The semiconductor device is disposed on the circuit substrate, wherein the semiconductor device is electrically connected to the circuit substrate through the plurality of electrical connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

providing an interposer substrate, wherein the interposer substrate comprises a plurality of dicing regions and a plurality of device regions;

bonding semiconductor dies on the interposer substrate in the plurality of device regions;

forming trenches on a first surface of the interposer substrate within the plurality of dicing regions;

forming an insulating encapsulant surrounding the semiconductor dies and filling the trenches on the first surface;

performing a first dicing process by removing portions of the interposer substrate from a second surface of the interposer substrate opposite to the first surface to form beveled trenches;

forming a first polymer layer on the second surface of the interposer substrate and filling the beveled trenches, and forming first conductive patterns embedded in the first polymer layer, wherein the first polymer layer is vertically overlapped with each of the semiconductor dies in a thickness direction of the interposer substrate; and after forming the first polymer layer and the first conductive patterns, forming a second polymer layer on the first polymer layer, and covering the first conductive patterns.

2. The method according to claim 1, further comprising:

performing a second dicing process by cutting through the first polymer layer, the second polymer layer and the insulating encapsulant in the plurality of dicing regions so that each of the plurality of device regions of the interposer substrate are separated from one another, and that sidewalls of the second polymer layer are vertically aligned with sidewalls of the first polymer layer, and vertically aligned with sidewalls of the insulating encapsulant.

3. The method according to claim 1, further comprising:

forming a plurality of second conductive patterns in the second polymer layer, wherein the plurality of second conductive patterns are electrically connected to the first conductive patterns, and the second polymer layer is located between and separating the first conductive patterns from the plurality of second conductive patterns; and forming a plurality of electrical connectors on the plurality of second conductive patterns.

4. The method according to claim 1, wherein the first dicing process further removes portions of the insulating encapsulant, and wherein after the first dicing process, the interposer substrate is formed with a first beveled surface and the insulating encapsulant is formed with a second beveled surface.

5. The method according to claim 4, wherein the first polymer layer and the second polymer layer are respectively formed with a central portion and a flank portion, and wherein the central portion of the first polymer layer is formed to contact the second surface of the interposer substrate, while the flank portion of the first polymer layer is formed to contact the first beveled surface of the interposer substrate and the second beveled surface of the insulating encapsulant.

6. The method according to claim 1, wherein the insulating encapsulant is formed with a first portion surrounding and contacting the semiconductor dies, and a second protruding portion surrounding the first portion and partially surrounding the interposer substrate.

7. The method according to claim 1, wherein the interposer substrate is provided with a core portion, conductive pads formed on the core portion and exposed at the first surface of the interposer substrate, and through vias embedded in the core portion, and prior to performing the first dicing process, the method further comprises thinning down the core portion of the interposer substrate so that the through vias are exposed from the second surface of the interposer substrate.

8. A method, comprising:

forming a semiconductor package, comprising:

placing a plurality of semiconductor dies on an interposer structure, wherein the interposer structure comprises through vias;

after placing the plurality of semiconductor dies on the interposer structure, removing portions of the interposer structure from two opposing surfaces of the interposer structure in at least two different steps so that the interposer structure is formed with beveled surfaces, wherein the at least two different steps comprise:

a first step of removing a first portion from a first surface of the interposer structure to form a first trench, wherein after the first step, an insulating encapsulant surrounding the semiconductor dies is formed, and the insulating encapsulant is filled into the first trench;

after removing the portions of the interposer in the at least two different steps, forming a dielectric layer on the interposer structure covering the beveled surfaces and covering the through vias;

patterning the dielectric layer to form openings revealing the through vias of the interposer structure; and forming conductive patterns in the openings of the dielectric layer;

bonding the semiconductor package to a circuit substrate; and forming an underfill structure in between the semiconductor package and the circuit substrate, wherein the underfill structure is physically separated from the interposer structure.

9. The method according to claim 8, wherein the interposer structure is formed with a first material having a first coefficient of thermal expansion (CTE) value, the dielectric layer is formed with a second material that has a second CTE value, wherein the second CTE value is a value within a first range, and the first range is non-overlapped with the first CTE value.

10. The method according to claim 9, wherein the underfill structure is formed with a third material different from the second material, and having a third CTE value, wherein the third CTE value is a value within a second range, and the second range is overlapped with the first range.

11. The method according to claim 8, wherein removing the portions of the interposer structure from the two opposing surfaces of the interposer structure in the at least two different steps further comprise:

a second step of removing a second portion from a second surface of the interposer structure to form a second trench, wherein the second surface is opposite to the first surface.

12. The method according to claim 11, wherein the first trench is formed with linear sidewalls, and wherein the second trench is formed with beveled sidewalls.

13. The method according to claim 8, wherein placing the plurality of semiconductor dies on the interposer structure, comprises electrically connecting the plurality of semiconductor dies to the through vias of the interposer structure through a plurality of conductive bumps, and the method further comprises forming an underfill material surrounding the plurality of conductive bumps.

14. The method according to claim 8, wherein prior to forming the-dielectric layer, the method further comprises removing a portion of the insulating encapsulant so that the insulating encapsulant is formed with beveled surfaces.

15. A method, comprising:

forming a package structure, comprising:

providing an interposer structure including a core substrate and a plurality of through vias formed in the core substrate;

placing a semiconductor die on a backside surface of the interposer structure, wherein the semiconductor die is electrically connected to the plurality of through vias;

forming an insulating encapsulant on the backside surface of the interposer structure and surrounding the semiconductor die;

performing a removal process by removing portions of the interposer structure and portions of the insulating encapsulant, wherein after the removal process, the interposer structure is formed with a first beveled surface and the insulating encapsulant is formed with a beveled top surface that is aligned with the first beveled surface, and a top surface of the interposer is exposed; and forming a polymer layer on the top surface of the interposer structure to isolate and protect the interposer structure from outside components, wherein the polymer layer is covering and in direct contact with the first beveled surface and the beveled top surface, and wherein the polymer layer is formed with a material that has a first CTE value, and the first CTE value is a value within a first range, and the first range is non-overlapped with a CTE value of the interposer structure, and is in a range of 20 to 100 ppm/° C., and the polymer layer is vertically overlapped with the semiconductor die in a thickness direction of the interposer structure;

placing the package structure onto a circuit substrate; and forming an underfill structure in between the package structure and the circuit substrate, wherein the underfill structure is formed with a material different than that of the interposer structure and the polymer layer, and the insulating encapsulant and the polymer layer isolates the interposer structure from contacting the underfill structure.

16. The method according to claim 15, wherein the method further comprises:

performing a dicing process by cutting through the insulating encapsulant and the polymer layer to form the package structure.

17. The method according to claim 15, further comprising:

after the removal process and after forming the polymer layer, forming a plurality of first conductive patterns in the polymer layer;

after forming the polymer layer, forming a second polymer layer on the polymer layer; and after forming the second polymer layer, forming a plurality of second conductive patterns in the second polymer layer, wherein the plurality of second conductive patterns is electrically connected to the plurality of first conductive patterns.

18. The method according to claim 15, wherein the polymer layer is formed with a central portion and a flank portion, and wherein the central portion is formed to contact the top surface of the interposer structure and isolate the top surface of the interposer structure from contacting the underfill structure, the flank portion is formed to cover and contact the first beveled surface and the beveled top surface, and sidewalls of the flank portion is aligned with sidewalls of the insulating encapsulant.

19. The method according to claim 17, wherein the polymer layer and the second polymer layer are formed with aligned sidewalls, and wherein the plurality of first conductive patterns are formed to vertically overlap with the semiconductor die and the underfill structure.

20. The method according to claim 8, wherein the dielectric layer and the conductive patterns are formed after removing the portions of the interposer structure in the at least two different steps, and patterning the dielectric layer comprises performing one or more etching processes to form the openings.

* * * * *